(12) United States Patent
Wasaki et al.

(10) Patent No.: US 7,378,943 B2
(45) Date of Patent: *May 27, 2008

(54) NOISE SUPPRESSING CIRCUIT

(75) Inventors: Masaru Wasaki, deceased, late of Ichihara (JP); by Hitomi Wasaki, legal representative, Ichihara (JP); Yoshihiro Saitoh, Chuo-ku (JP)

(73) Assignee: TDK Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/514,432

(22) PCT Filed: May 19, 2003

(86) PCT No.: PCT/JP03/06193

§ 371 (c)(1),
(2), (4) Date: Nov. 16, 2004

(87) PCT Pub. No.: WO03/098799

PCT Pub. Date: Nov. 27, 2003

(65) Prior Publication Data
US 2006/0049890 A1   Mar. 9, 2006

(30) Foreign Application Priority Data
May 20, 2002   (JP)   .............................. 2002-144817

(51) Int. Cl.
*G05B 11/01* (2006.01)

(52) U.S. Cl. .............................. 340/310.11; 340/310.17

(58) Field of Classification Search ........... 340/310.11, 340/310.13, 310.15, 310.17, 310.18
See application file for complete search history.

(56) References Cited

U.S. PATENT DOCUMENTS 4,475,214 A * 10/1984 Gutleber ..................... 375/254

(Continued)

FOREIGN PATENT DOCUMENTS

JP   53-54447 A   5/1978

(Continued)

*Primary Examiner*—Phung T. Nguyen
(74) *Attorney, Agent, or Firm*—Oliff & Berridge, PLC

(57) ABSTRACT

A noise suppressing circuit (1) suppresses noise emerging from an electronic apparatus (2) and propagating through conductive lines (3a and 3b). The noise suppressing circuit (1) comprises a low-band noise reducing circuit (10) and a high-band noise reducing circuit (80). The low-band noise reducing circuit (10) is connected to the electronic apparatus (2) through the conductive lines (3a and 3b). The high-band noise reducing circuit (80) is cascade-connected to the low-band noise reducing circuit (10) and connected to conductive lines (4a and 4b) of a power line (4). The high-band noise reducing circuit (80) comprises: a detection circuit for detecting common mode noise propagating through the conductive lines (3a and 3b); a phase-inverted signal generating circuit for generating a phase-inverted signal that has a phase opposite to the phase of the noise detected by the detection circuit; and an injection circuit for injecting the phase-inverted signal generated by the phase-inverted signal generating circuit into the conductive lines (3a and 3b).

12 Claims, 16 Drawing Sheets

U.S. PATENT DOCUMENTS

| | | | | |
|---|---|---|---|---|
| 4,783,817 | A * | 11/1988 | Hamada et al. | 381/71.5 |
| 6,313,738 | B1 * | 11/2001 | Wynn | 307/3 |
| 6,317,031 | B1 * | 11/2001 | Rickard | 307/3 |
| 6,329,905 | B1 * | 12/2001 | Cunningham | 375/273 |
| 6,373,674 | B1 * | 4/2002 | Sugiura et al. | 361/118 |
| 6,441,723 | B1 * | 8/2002 | Mansfield et al. | 340/538.11 |
| 2002/0063474 | A1 | 5/2002 | Wasaki et al. | |

FOREIGN PATENT DOCUMENTS

| | | |
|---|---|---|
| JP | 63-688 U | 1/1988 |
| JP | 1-105215 U | 7/1989 |
| JP | 02-078327 A | 3/1990 |
| JP | 3-3829 U | 1/1991 |
| JP | 03-296313 A | 12/1991 |
| JP | 04-362805 A | 12/1992 |
| JP | 05-153782 A | 6/1993 |
| JP | 07-115339 A | 5/1995 |
| JP | 08-032394 A | 2/1996 |
| JP | 09-116367 A | 5/1997 |
| JP | 10-262364 A | 9/1998 |
| JP | 10-303674 A | 11/1998 |
| JP | 2000-323951 A | 11/2000 |
| JP | 2002-204189 A | 7/2002 |
| WO | WO 02/37674 A1 | 5/2002 |

* cited by examiner

NOISE SUPPRESSING CIRCUIT

TECHNICAL FIELD

The present invention relates to a noise suppressing circuit for suppressing noise propagating through a conductive line.

BACKGROUND ART

It is known that an electronic apparatus such as a switching power supply carries noise that may have a wide range of frequencies from a frequency as low as 100 kHz to a frequency as high as several hundred MHz. Noise emerging from an electronic apparatus is sent to another electronic apparatus through an alternate current power line, and may affect the other electronic apparatus. Therefore, in many countries, various restrictions are placed on conducted noise, that is, noise emerging from an electronic apparatus and emitted outside through an alternate current power line. According to the restrictions on conducted noise imposed in a great part of such countries, the frequency range to be restricted ranges from 150 kHz or 450 kHz to 30 MHz. The noise at a frequency of 30 MHz or higher applies to a restriction on emission noise.

FIG. 21 and FIG. 22 illustrate examples of frequency characteristics of conducted noise of a switching power supply wherein no measure is taken for suppressing noise. FIG. 21 shows the characteristic in a frequency range of 0 to 1 MHz. FIG. 22 shows the characteristic in a frequency range of 0 to 200 MHz. In FIG. 21 and FIG. 22 peak values of the conducted noise are shown. In FIG. 21 and FIG. 22 numeral 201 indicates a frequency range in which common mode noise exists. In FIG. 21 numeral 202 indicates a frequency range in which normal mode noise causes a problem. In FIG. 21 and FIG. 22 numeral 203 indicates an example of frequency range that applies to the restriction on conducted noise. In FIG. 21 numeral 204 indicates a permissible level of conducted noise according to the European Standard EN55022 corresponding to the standard of the International Special Committee on Radio Interference (CISPR). In FIG. 21 numeral 205 indicates a permissible level of conducted noise according to the Class B of the standard of the Federal Communications Commission (FCC). As shown in FIG. 21 and FIG. 22, the noise emerging from the switching power supply exists in a wide range of frequencies including a range of 150 kHz to 30 MHz that applies to the restriction on conducted noise and a range of 30 MHz and higher that applies to the restriction on radiated noise.

In FIG. 21 a frequency of approximately 75 kHz at which a great peak of conducted noise arises is a switching frequency of the switching power supply. As shown in FIG. 21, it is noted that a plurality of harmonics pertaining to the switching frequency creat a great noise.

To prevent the adverse effect of noise as described above, in prior art, a noise filter circuit as shown in FIG. 23 is often provided between the power line and the electronic apparatus that develops noise. The noise filter circuit of FIG. 23 will now be described. The noise filter circuit comprises: two terminals 101a and 101b connected to the power line; and two terminals 102a and 102b connected to the electronic apparatus as a noise source. The noise filter circuit further comprises: a capacitor 111 having an end connected to the terminal 101a and the other end connected to the terminal 101b; a common mode choke coil 112 provided between the terminals 101a and 101b and the terminals 102a and 102b; a capacitor 113 having an end connected to the terminal 102a and the other end grounded; a capacitor 114 having an end connected to the terminal 102b and the other end grounded; and a capacitor 115 having an end connected to the terminal 102a and the other end connected to the terminal 102b. The common mode choke coil 112 has one magnetic core 112a and two windings 112b and 112c wound around the core 112a. The winding 112b has an end connected to the terminal 101b and the other end connected to the terminal 102a. The winding 112c has an end connected to the terminal 101b and the other end connected to the terminal 102b. The windings 112b and 112c are wound around the core 112a in such directions that, when magnetic fluxes are induced in the core 112a by currents flowing through the windings 112b and 112c when a normal mode current is fed to the windings 112b and 112c, these fluxes are cancelled out by each other.

Among the components of the noise filter circuit of FIG. 23, the common mode choke coil 112 and the capacitors 113 and 114 have a function of reducing common mode noise. Typically, the combination of the capacitors 113 and 114 is called a Y capacitor. The capacitors 111 and 115 have a function of reducing normal mode noise. Each of the capacitors 111 and 115 is typically called an X capacitor or an across-the-line capacitor.

Problems that the noise filter circuit of FIG. 23 has will now be described. The problem relating to the measure taken against common mode noise of the noise filter circuit will be described first. In many countries the leakage current flowing through the capacitors 113 and 114 of FIG. 23 is limited to a specific standard value or below so as to assure safety, that is, to prevent shock hazards. The leakage current is proportional to the capacitance of the capacitors 113 and 114. Therefore, the capacitance of the capacitors 113 and 114 is limited to a specific value or below. The capacitance of the capacitors 113 and 114 is typically limited to several thousand picofarads (pF) or below although the standard value of leakage current depends on the circumstances and the supply voltage of each country.

FIG. 24 shows an example of frequency characteristic of impedance of the Y capacitor including the capacitors 113 and 114. FIG. 24 shows the characteristics each obtained when the capacitance of each of the capacitors 113 and 114 is 330 pF, 680 pF, 1000 pF, 2200 pF, 4700 pF or 10000 pF.

In the example of frequency characteristic of conducted noise of the switching power supply of FIG. 21, the noise level is high in a frequency range of 500 kHz and lower. However, as shown in FIG. 24, the impedance of the Y capacitor is high in a frequency range of 500 kHz and lower, and the Y capacitor does not make a great contribution to a reduction in common mode noise in this frequency range. Therefore, the noise filter circuit of FIG. 21 has a problem that it is not capable of sufficiently reducing common mode noise in a frequency range of 500 kHz and lower.

The problem relating to the measure taken against normal mode noise of the noise filter circuit of FIG. 23 will now be described. In the noise filter circuit of FIG. 23, there exists leakage inductance that results from leakage of magnetic flux in the common mode choke coil 112. FIG. 25 illustrates a circuit made up of the noise filter circuit of FIG. 23 to which imaginary coils having an inductance equal to the leakage inductance are added. The circuit of FIG. 25 is made up of the circuit of FIG. 23 in which the imaginary coil 116 is provided between the winding 112b of the common mode choke coil 112 and the terminal 102a, and the imaginary coil 117 is provided between the winding 112c of the common mode choke coil 112 and the terminal 102b.

In the circuit of FIG. 25 the elements having a function of reducing normal mode noise are the capacitors 111 and 115 and the coils 116 and 117. These elements make up a π filter. However, the inductance of the coils 116 and 117, that is, the leakage inductance of the common mode choke coil 112 depends on the inductance of the coil 112 and the coupling coefficient between the windings 112*b* and 112*c* of the coil 112. Therefore, typically, it is difficult that the leakage inductance has a great value and it is difficult to design the circuit such that the leakage inductance has a specific value.

Typically, normal mode noise is problematic in a low frequency range of 1 MHz and lower. In such a frequency range the absolute value of impedance of the coil is expressed as 2 πfL where 'f' is a frequency. Therefore, a coil having a high inductance is required for increasing the absolute value of impedance of the coil and thereby sufficiently reducing normal mode noise in a low frequency range of 1 MHz and lower. Because of these reasons, the noise filter circuit of FIG. 23 has a problem that it is not capable of sufficiently reducing normal mode noise.

To overcome the foregoing problems, many of actual noise filter circuits have a configuration as shown in FIG. 26. The noise filter circuit of FIG. 26 comprises: the two terminals 101*a* and 101*b* connected to the power line; and the two terminals 102*a* and 102*b* connected to an electronic apparatus as a noise source. The noise filter circuit further comprises: a fuse 121 having an end connected to the terminal 101*a*; a capacitor 111 having an end connected to the other end of the fuse 121 and the other end connected to the terminal 101*b*; and the common mode choke coil 112 connected to the ends of the capacitor 111. The common mode choke coil 112 has the one magnetic core 112*a* and the two windings 112*b* and 112*c* wound around the core 112*a*. The winding 112*b* has an end connected to the other end of the fuse 121. The winding 112*c* has an end connected to the terminal 101*b*.

The noise filter circuit of FIG. 26 further comprises: a capacitor 122 having an end connected to the other end of the winding 112*b* and the other end connected to the other end of the winding 112*c*; a capacitor 123 having an end connected to the other end of the winding 112*b* and the other end grounded; a capacitor 124 having an end connected to the other end of the winding 112*c* and the other end grounded; and a common mode choke coil 125 provided between the capacitors 123 and 124 and the terminals 102*a* and 102*b*. The common mode choke coil 125 has one magnetic core 125*a* and two windings 125*b* and 125*c* wound around the core 125*a*. The winding 125*b* has an end connected to the one of the ends of the capacitor 123 and has the other end connected to the terminal 102*a*. The winding 125*c* has an end connected to the one of the ends of the capacitor 124 and has the other end connected to the terminal 102*b*.

The noise filter circuit of FIG. 26 substantially has a configuration in which the common mode choke coil 125 is added to the noise filter circuit of FIG. 23. According to the noise filter circuit of FIG. 26, the common mode choke coil 125 works for compensating for the insufficient function of reducing common mode noise and the insufficient function of reducing normal mode noise of the noise filter circuit of FIG. 23. However, the noise filter circuit of FIG. 26 has a problem that, since it has the two common mode choke coils 112 and 125, the circuit configuration is complicated and the noise filter circuit is increased in size.

In the noise filter circuit of FIG. 26, it is required to increase the leakage inductance of each of the common mode choke coils 112 and 125 so as to sufficiently reduce normal mode noise in a low frequency range of 1 MHz and lower. To achieve this, it is required to increase the number of turns of the coils 112 and 115. However, if the number of turns of the coils 112 and 115 is increased, there arises a problem that the interwinding stray capacitance is increased and the effect of reducing noise in a high frequency range is reduced. Alternatively, each of the coils 112 and 125 may have a structure in which the turns are divided into a plurality of portions by separators to reduce the interwinding stray capacitance of the coils 112 and 125. However, this raises the costs of the coils 112 and 125.

DISCLOSURE OF THE INVENTION

It is an object of the invention to provide a noise suppressing circuit for suppressing noise in a wide range of frequencies.

A noise suppressing circuit of the invention is a circuit that is inserted somewhere along two conductive lines connected to a noise source and that suppresses noise emerging from the noise source and propagating through the conductive lines. The noise suppressing circuit comprises: a first noise reducing circuit for reducing noise mainly in a first frequency range; and a second noise reducing circuit for reducing noise mainly in a second frequency range including frequencies lower than frequencies in the first frequency range. The first noise reducing circuit incorporates: a detection means disposed in a specific location along the conductive lines and detecting noise propagating through the conductive lines; a phase-inverted signal generating means for generating a phase-inverted signal that has a phase opposite to a phase of the noise detected by the detection means; and a noise canceling means disposed in a location different from the location of the detection means along the conductive lines and injecting the phase-inverted signal generated by the phase-inverted signal generating means into the conductive lines to cancel out the noise on the conductive lines.

According to the noise suppressing circuit of the invention, the first noise reducing circuit reduces noise in the first frequency range, and the second noise reducing circuit reduces noise in the second frequency range including frequencies lower than frequencies in the first frequency range.

According to the noise suppressing circuit of the invention, the first noise reducing circuit may reduce common mode noise.

According to the noise suppressing circuit of the invention, the second noise reducing circuit may reduce normal mode noise.

In the noise suppressing circuit of the invention, the second noise reducing circuit may include a parallel resonant circuit that resonates at a specific resonant frequency and may reduce noise in a frequency range including the resonant frequency.

If the second noise reducing circuit includes the parallel resonant circuit, the frequency range in which the second noise reducing circuit reduces the noise may include a frequency at which the magnitude of noise emerging from the noise source has a peak value.

In the noise suppressing circuit of the invention, the second noise reducing circuit may incorporate a coil inserted somewhere along one of the conductive lines and a capacitor connected in parallel to the coil, and the coil and the capacitor may make up the parallel resonant circuit.

In the noise suppressing circuit of the invention, the second noise reducing circuit may incorporate a single magnetic core, two windings wound around the core, and a capacitor connected in parallel to one of the windings, wherein the one of the windings may be inserted somewhere along one of the conductive lines, the other of the windings may be inserted somewhere along the other of the conductive lines, and the one of the windings and the capacitor may make up the parallel resonant circuit.

In the noise suppressing circuit of the invention, the second noise reducing circuit may incorporate a first coil inserted somewhere along one of the conductive lines, a first capacitor connected in parallel to the first coil, and a second coil inserted somewhere along the other of the conductive lines, a second capacitor connected in parallel to the second coil, wherein the first coil and the first capacitor may make up a first parallel resonant circuit and the second coil and the second capacitor may make up a second parallel resonant circuit.

In the noise suppressing circuit of the invention, the second noise reducing circuit may incorporate a coil inserted somewhere along one of the conductive lines, a first capacitor connected in parallel to the coil, a single magnetic core, two windings wound around the core, and a second capacitor connected in parallel to one of the windings, wherein the one of the windings may be inserted somewhere along one of the conductive lines, the other of the windings may be inserted somewhere along the other of the conductive lines, the coil and the first capacitor may make up a first parallel resonant circuit, and the one of the windings and the second capacitor may make up a second parallel resonant circuit.

In the noise suppressing circuit of the invention, the second noise reducing circuit may incorporate a single magnetic core, a first winding and a second winding that are wound around the core, and a capacitor provided across the second winding, wherein the first winding may be inserted somewhere along one of the conductive lines and the second winding and the capacitor may make up the parallel resonant circuit.

In the noise suppressing circuit of the invention, the second noise reducing circuit may incorporate a single magnetic core, and a first winding and a second winding that are wound around the core, wherein the first winding may be inserted somewhere along one of the conductive lines, and the second winding may make up the parallel resonant circuit that resonates at a resonant frequency determined by an inductance of the second winding and an interwinding stray capacitance of the second winding.

According to the noise suppressing circuit of the invention, the resonant frequency of the parallel resonant circuit may be 1 MHz or lower.

Other and further objects, features and advantages of the invention will appear more fully from the following description.

BEST MODE FOR CARRYING OUT THE INVENTION

A preferred embodiment of the invention will now be described in detail with reference to the accompanying drawings.

Figure 1:
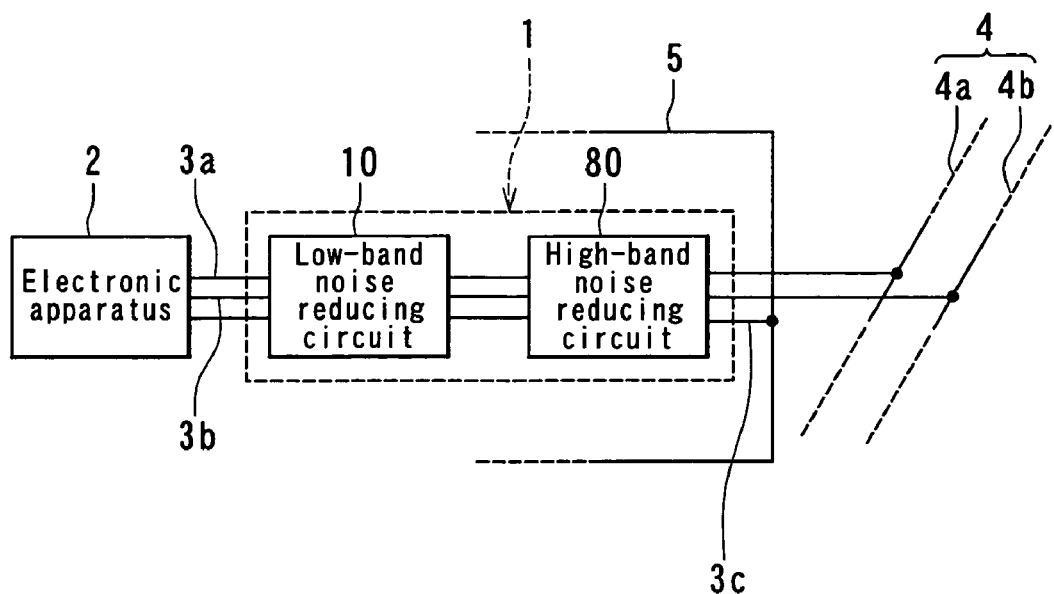
FIG. 1 is a schematic diagram illustrating an overview of configuration of a noise suppressing circuit of an embodiment of the invention.

Reference is now made to FIG. 1 to describe an overview of configuration of a noise suppressing circuit of the embodiment of the invention. The noise suppressing circuit 1 of the embodiment is designed to be inserted somewhere along two conductive lines 3a and 3b connected to an electronic apparatus 2 as a noise source. The conductive lines 3a and 3b are designed to be connected to a power line 4 for transmitting alternating current power or direct current power. The power line 4 includes two conductive lines 4a and 4b. The conductive lines 3a and 3b are designed to be connected to the conductive lines 4a and 4b, respectively. The electronic apparatus 2 receives power from the power line 4 through the conductive lines 3a and 3b. The electronic apparatus 2 is a switching power supply, for example.

The noise suppressing circuit 1 is designed to suppress noise emerging from the electronic apparatus 2 and propagating through the conductive lines 3a and 3b. The noise suppressing circuit 1 comprises a low-band noise reducing circuit 10 and a high-band noise reducing circuit 80. The low-band noise reducing circuit 10 is connected to the electronic apparatus 2 through the conductive lines 3a and 3b. The high-band noise reducing circuit 80 is cascade-connected to the low-band noise reducing circuit 10 and connected to the conductive lines 4a and 4b of the power line 4. Alternatively, the arrangement of the low-band noise reducing circuit 10 and the high-band noise reducing circuit 80 between the electronic apparatus 2 and the power line 4 may be the reverse of the one shown in FIG. 1.

The high-band noise reducing circuit 80 mainly reduces noise in a first frequency range. The low-band noise reducing circuit 10 mainly reduces noise in a second frequency range that includes frequencies lower than the frequencies within the first frequency range. The high-band noise reducing circuit 80 corresponds to the first noise reducing circuit of the invention. The low-band noise reducing circuit 10 corresponds to the second noise reducing circuit of the invention. The first frequency range may be a range including a range of 1 MHz to 30 MHz, for example. The second frequency range may be a range of 0 MHz to 1 MHz, or a part of this range, for example.

The low-band noise reducing circuit 10 and the high-band noise reducing circuit 80 are encased in an enclosure 5 that functions as the ground for the circuits 10 and 80. Portions of the low-band noise reducing circuit 10 and the high-band noise reducing circuit 80 that are connected to the ground are connected to a ground line 3c. The ground line 3c is electrically connected to the enclosure 5. The high-band noise reducing circuit 80 may be located closer to the enclosure 5 than the low-band noise reducing circuit 10. If the power line 4 has a ground line besides the conductive lines 4a and 4b, the ground line 3c may be electrically connected to this ground line of the power line 4.

The noise suppressing circuit 1 may be separated from the electronic apparatus 2 or may be integrated with the electronic apparatus 2. If the noise suppressing circuit 1 is separated from the electronic apparatus 2, the enclosure 5 is solely used for the noise suppressing circuit 1. If the noise suppressing circuit 1 is integrated with the electronic apparatus 2, the enclosure 5 may be provided for the electronic apparatus 2 or may be provided exclusively for the noise suppressing circuit 1 enclosed in an enclosure of the electronic apparatus 2. A portion of the electronic apparatus 2 connected to the ground may be connected to the ground line 3c.

Figure 2:
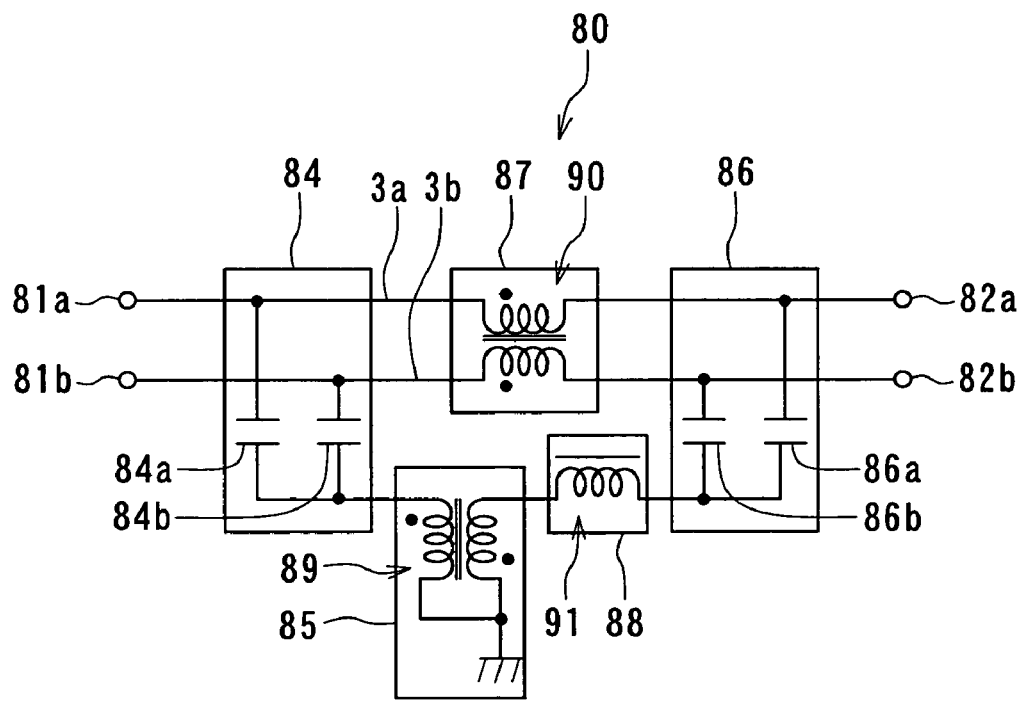
FIG. 2 is a schematic diagram illustrating an example of configuration of the high-band noise reducing circuit of FIG. 1.

Reference is now made to FIG. 2 to describe an example of specific circuit configuration of the high-band noise reducing circuit 80. The high-band noise reducing circuit 80 of FIG. 2 reduces common mode noise propagating through the conductive lines 3a and 3b. In the following description, the high-band noise reducing circuit 80 is disposed between the low-band noise reducing circuit 10 and the power line 4. The high-band noise reducing circuit 80 comprises: two terminals 81a and 81b connected to the low-band noise reducing circuit 10; and two terminals 82a and 82b connected to the conductive lines 4a and 4b of the power line 4.

The high-band noise reducing circuit 80 further comprises: a detection circuit 84 disposed in a specific location along the conductive lines 3a and 3b and provided for detecting common mode noise propagating through the conductive lines 3a and 3b; a phase-inverted signal generating circuit 85 for generating a phase-inverted signal having a phase opposite to the phase of noise detected by the detection circuit 84; an injection circuit 86 provided in a location along the conductive lines 3a and 3b different from the location of the detection circuit 84 and provided for injecting the phase-inverted signal generated at the phase-inverted signal generating circuit 85 into the conductive lines 3a and 3b; an impedance element 87 provided between the location of the detection circuit 84 and the location of the injection circuit 86 along the conductive lines 3a and 3b and having an impedance that reduces the peak value of noise passing therethrough; and an impedance element 88 provided between the phase-inverted signal generating circuit 85 and the injection circuit 86.

The detection circuit 84 corresponds to the detection means of the invention. The phase-inverted signal generating circuit 85 corresponds to the phase-inverted signal generating means of the invention. The injection circuit 86 corresponds to the noise canceling means of the invention.

The impedance element 88 is provided for adjusting the phase of the phase-inverted signal such that a phase difference of nearly 180 degrees is created between the noise inputted to the injection circuit 86 and the phase-inverted signal injected by the injection circuit 86 into the conductive lines 3a and 3b. It is also possible that the impedance element 88 adjusts the peak value of the phase-inverted signal injected by the injection circuit 86 into the conductive lines 3a and 3b to be a value close to the peak value of the noise inputted to the injection circuit 86.

The detection circuit 84 incorporates: a capacitor 84a having an end connected to the conductive line 3a and the other end connected to an input of the phase-inverted signal generating circuit 85; and a capacitor 84b having an end connected to the conductive line 3b and the other end connected to the input of the circuit 85. The capacitors 84a and 84b each allow high frequency components of voltage variations along the conductive lines 3a and 3b to pass therethrough, and intercept low frequency components including those of frequency of alternating current power. The injection circuit 86 incorporates: a capacitor 86a having an end connected to an output of the impedance element 88 and the other end connected to the conductive line 3a; and a capacitor 86b having an end connected to the output of the impedance element 88 and the other end connected to the conductive line 3b. In this example the injection circuit 86 gives the conductive lines 3a and 3b the same variations in voltage corresponding to the phase-inverted signal through the capacitors 86a and 86b.

The phase-inverted signal generating circuit 85 incorporates a transformer 89. An end of a primary winding of the transformer 89 is connected to the capacitors 84a and 84b. The other end of the primary winding of the transformer 89 is grounded together with an end of a secondary winding of the transformer 89. The other end of the secondary winding of the transformer 89 is connected to the impedance element 88. A common mode choke coil 90 is used as the impedance element 87. The impedance element 88 is made up of a line choke coil 91 or an impedance element having a phase characteristic equivalent to that of the line choke coil 91.

The capacitance of each of the capacitors 84a, 84b, 86a and 86b is determined such that the leakage current value will be within a specific standard value. To be specific, the capacitance of each of the capacitors 84a, 84b, 86a and 86b falls within a range of 10 to 20,000 pF, for example.

Although it is ideal that the turns ratio of the primary winding to the secondary winding is 1:1, the turns ratio may be changed, considering the attenuation of signals in the transformer 89.

The operation of the high-band noise reducing circuit 80 of FIG. 2 will now be described. Here, it is assumed that, in the high-band noise reducing circuit 80, noise that has developed in a portion of the conductive lines 3a and 3b closer to the detection circuit 84 than the impedance element 87 (hereinafter simply called the conductive lines 3a and 3b closer to the detection circuit 84) passes through the impedance element 87, and goes into a portion of the conductive lines 3a and 3b closer to the injection circuit 86 than the impedance element 87 (hereinafter simply called the conductive lines 3a and 3b closer to the injection circuit 86). In this case, the peak value of the noise on the conductive lines 3a and 3b closer to the injection circuit 86 is lower than the peak value of the noise on the conductive lines 3a and 3b closer to the detection circuit 84. According to the high-band noise reducing circuit 80, it is possible through the use of the impedance element 87 to maintain the state in which the peak value of the noise on the conductive lines 3a and 3b closer to the injection circuit 86 is different from the peak value of the noise on the conductive lines 3a and 3b closer to the detection circuit 84.

In the high-band noise reducing circuit 80 of FIG. 2, the detection circuit 84 detects common mode noise along the conductive lines 3a and 3b. The phase-inverted signal generating circuit 85 then generates a phase-inverted signal having a phase opposite to the phase of the noise detected by the detection circuit 84. Furthermore, the injection circuit 86 injects the phase-inverted signal generated by the phase-inverted signal generating circuit 85 into the conductive lines 3a and 3b. The common mode noise on the conductive lines 3a and 3b closer to the injection circuit 86 is thereby canceled out.

The peak value of the noise having passed through the impedance element 87 is lower than the peak value of the noise before passing through the impedance element 87. Therefore, it is required to adjust the peak value of the phase-inverted signal injected into the conductive lines 3a and 3b by the injection circuit 86 such that this peak value of the phase-inverted signal is close to the peak value of the noise that has passed through the impedance element 87 and is then inputted to the injection circuit 86.

Moreover, according to the high-band noise reducing circuit 80 of FIG. 2, it is possible through the use of the impedance element 88 that a phase difference of nearly 180 degrees is created between the noise inputted to the injection circuit 86 and the phase-inverted signal injected by the injection circuit 86 into the conductive lines 3a and 3b, and that the peak value of the phase-inverted signal injected by the injection circuit 86 into the conductive lines 3a and 3b is close to the peak value of the noise inputted to the injection circuit 86. As a result, according to the high-band noise reducing circuit 80, noise on the conductive lines 3a and 3b closer to the injection circuit 86 is reduced more effectively.

Figure 3:
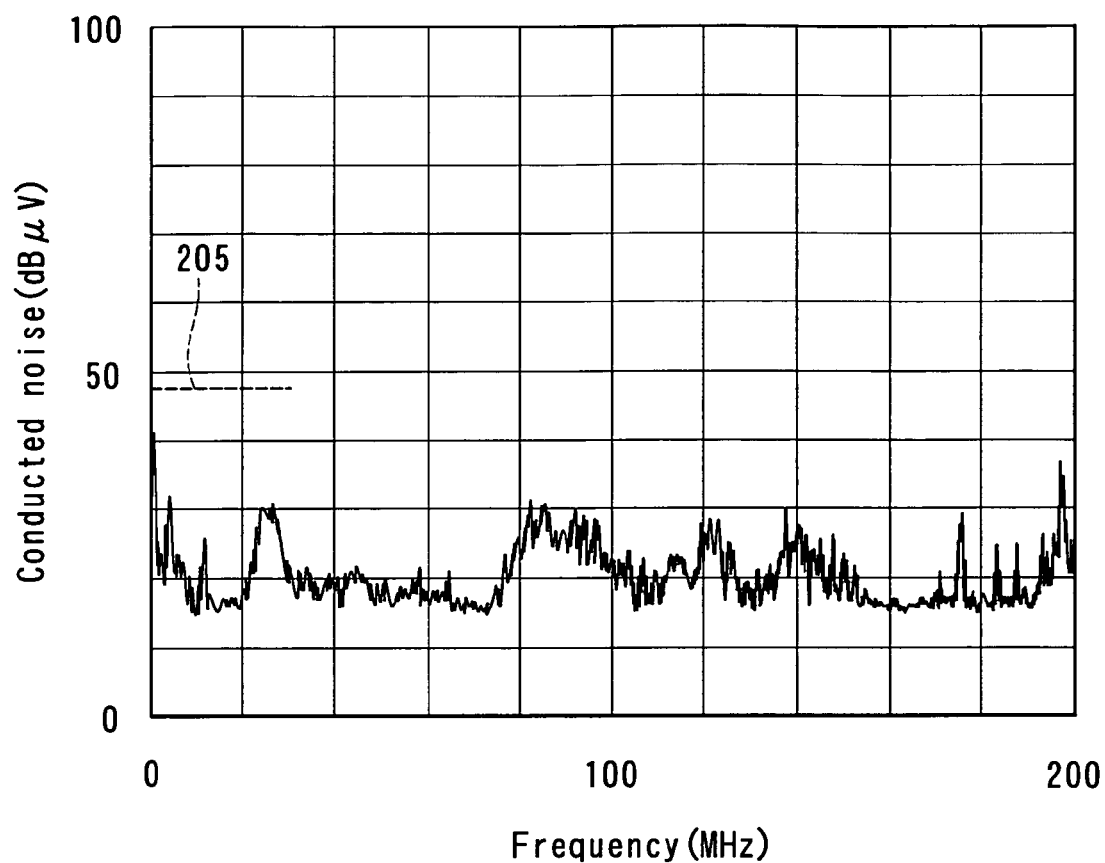
FIG. 3 is a plot showing an effect of the high-band noise reducing circuit of FIG. 2.
Figure 22:
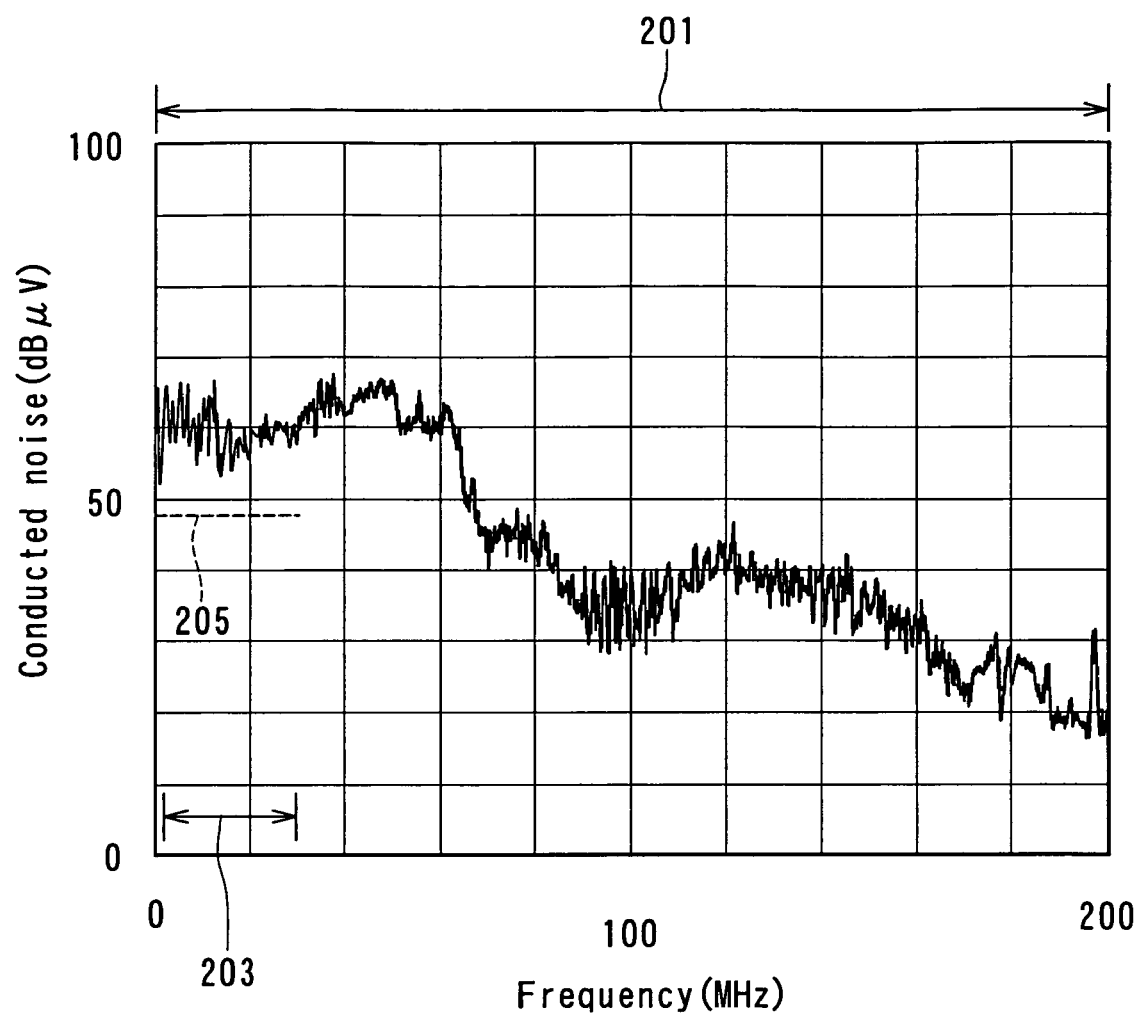
FIG. 22 is a plot showing an example of frequency characteristic of conducted noise of a switching power supply.
Figure 23:
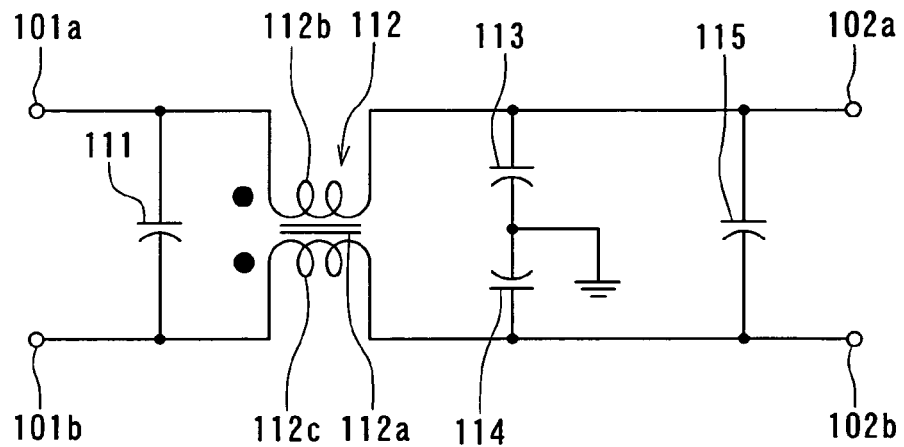
FIG. 23 is a schematic diagram illustrating an example of a noise filter circuit of related art.
Figure 24:
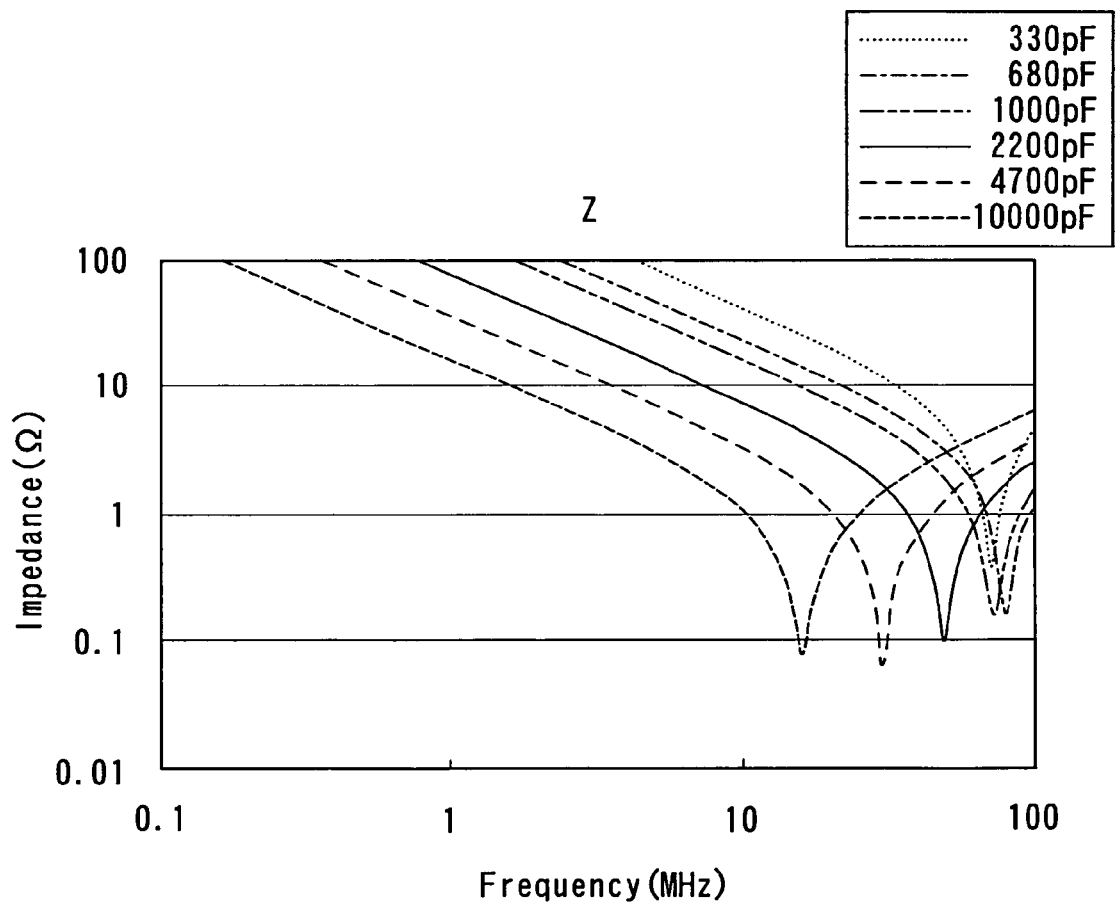
FIG. 24 is a plot showing an example of frequency characteristic of impedance of the Y capacitor of FIG. 23.
Figure 25:
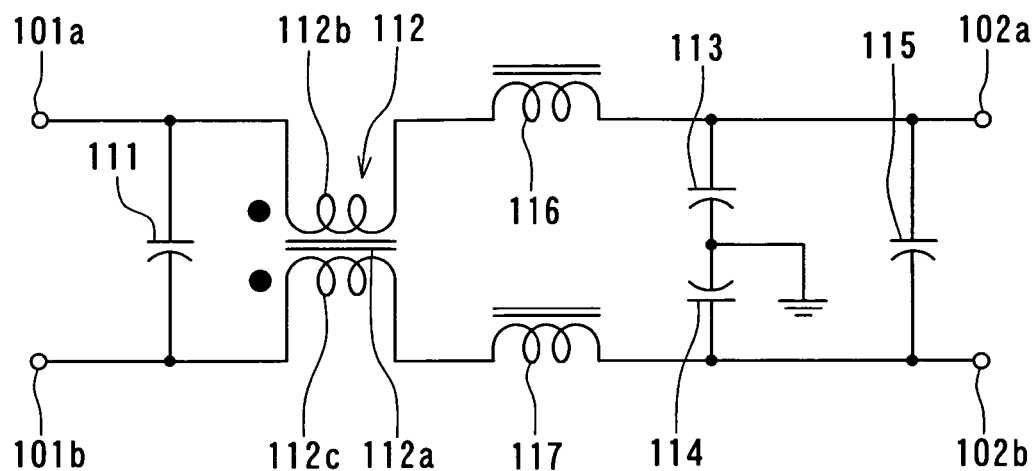
FIG. 25 is a schematic diagram of a circuit made up of the noise filter circuit of FIG. 23 to which imaginary coils having an inductance equal to the leakage inductance are added.

FIG. 3 is a plot showing an example of frequency characteristic of conducted noise obtained when the high-band noise reducing circuit 80 of FIG. 2 is connected to the switching power supply having the frequency characteristic of conducted noise shown in FIG. 22. The example of FIG. 3 shows a peak value of conducted noise. In this example the capacitors 84a and 84b have a capacitance of 2200 pF, the capacitors 86a and 86b have a capacitance of 1000 pF, and the coils 89, 90 and 91 have inductances of 0.1 mH or smaller, 3 mH or smaller, and 3 mH or smaller, respectively. If comparison is made between FIG. 3 and FIG. 22, it is noted that it is possible through the use of the high-band noise reducing circuit 80 to reduce noise in a frequency range of 1 MHz and higher.

Figure 4:
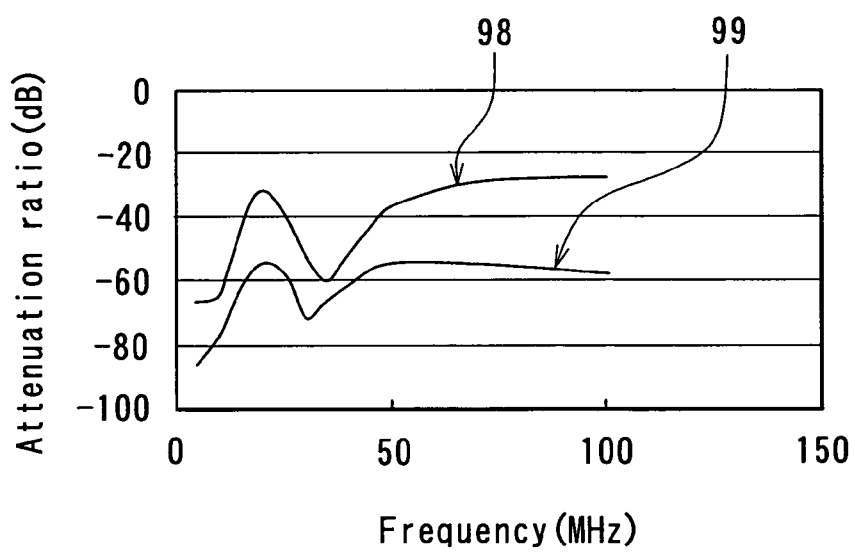
FIG. 4 is a plot showing a characteristic of the high-band noise reducing circuit of FIG. 2 and a characteristic of a noise filter circuit of FIG. 26.
Figure 26:
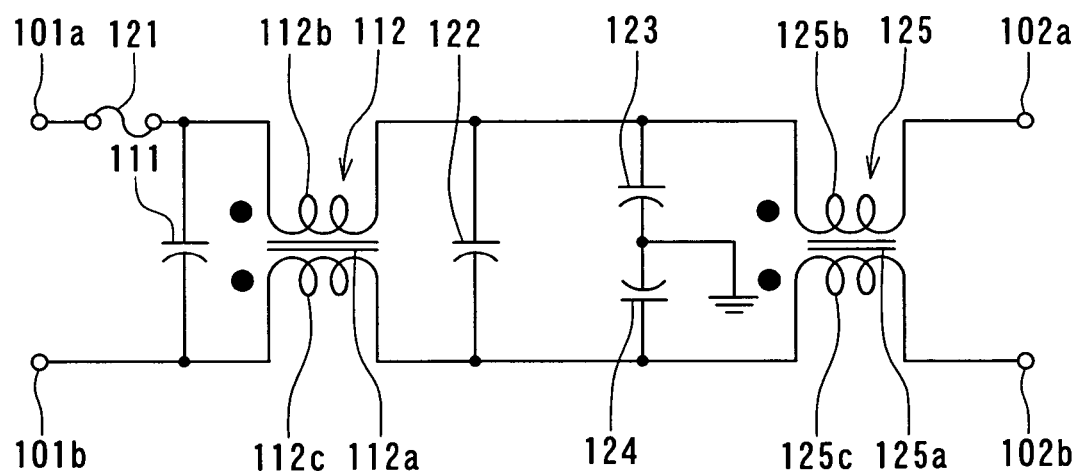
FIG. 26 is a schematic diagram illustrating another example of the noise filter circuit.

FIG. 4 is a plot showing an example of frequency characteristic of attenuation ratio of each of the high-band noise reducing circuit 80 of FIG. 2 and the noise filter circuit of FIG. 26. In FIG. 4 numeral 98 indicates a characteristic of the noise filter circuit of FIG. 26. Numeral 99 indicates a characteristic of the high-band noise reducing circuit 80 of FIG. 2. According to the example of FIG. 4, the capacitors 84a and 84b of FIG. 2 have a capacitance of 2200 pF, the capacitors 86a and 86b have a capacitance of 1000 pF, and the coils 89, 90 and 91 have inductances of 0.1 mH or smaller, 3 mH or smaller, and 3 mH or smaller, respectively. According to the example of FIG. 4, in the noise filter circuit of FIG. 26, the capacitor 111 has a capacitance of 0.47 µF, the capacitor 122 has a capacitance of 0.47 µF, the capacitors 123 and 124 have a capacitance of 2200 pF, and the coils 112 and 125 each have an inductance of 10 mH.

As shown in FIG. 4, the high-band noise reducing circuit 80 of FIG. 2 exhibits a noise reducing effect greater than that of the noise filter circuit of FIG. 26 within a frequency range of 1 MHz and higher. However, it is difficult to obtain a sufficient noise reducing effect in a frequency range lower than 1 MHz through the use of the high-band noise reducing circuit 80 of FIG. 2. This is because, in the high-band noise reducing circuit 80 of FIG. 2, the leakage current flowing through the capacitors 84a, 84b, 86a and 86b is limited, so that the capacitance of each of the capacitors 84a, 84b, 86a and 86b is limited.

Regarding this problem, the embodiment achieves the noise suppressing circuit 1 for suppressing noise in a wide range of frequencies by providing the low-band noise reducing circuit 10 cascade-connected to the high-band noise reducing circuit 80.

Figure 5:
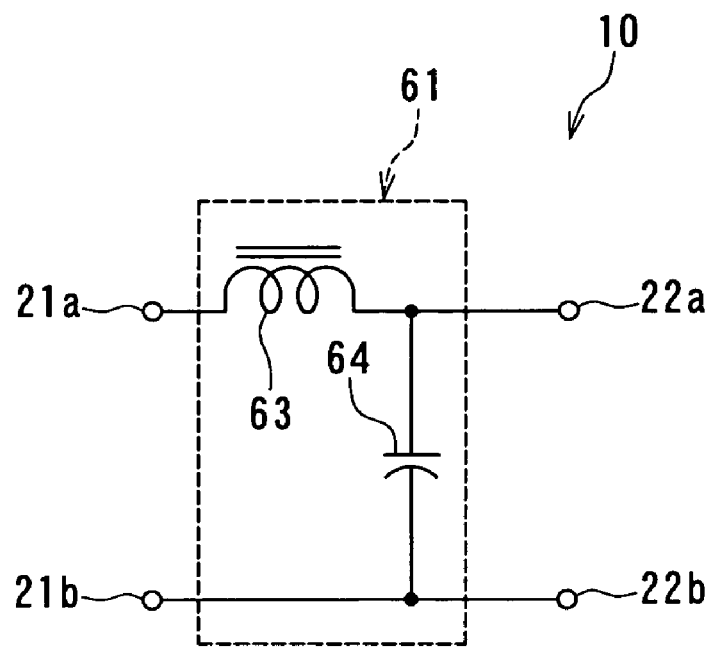
FIG. 5 is a schematic diagram illustrating an example of configuration of the low-band noise reducing circuit of FIG. 1.
Figure 6:
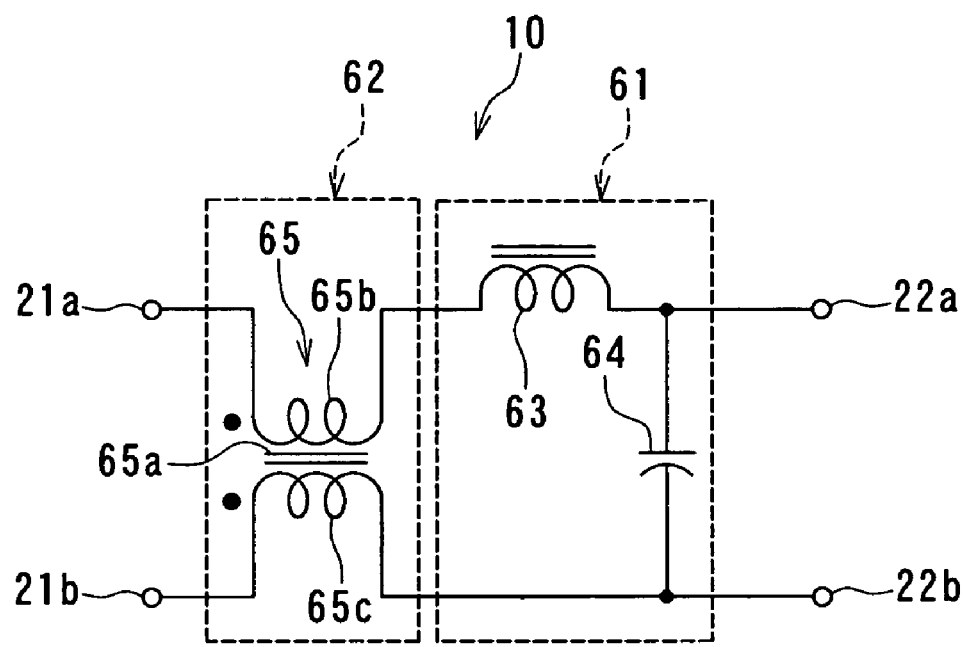
FIG. 6 is a schematic diagram illustrating another example of configuration of the low-band noise reducing circuit of FIG. 1.

Reference is now made to FIG. 5 and FIG. 6 to describe two examples of specific circuit configuration of the low-band noise reducing circuit 10. In the following description the low-band noise reducing circuit 10 is located between the electronic apparatus 2 and the high-band noise reducing circuit 80.

The low-band noise reducing circuit 10 of FIG. 5 comprises: two terminals 21a and 21b connected to the electronic apparatus 2; and two terminals 22a and 22b connected to the two terminals 81a and 81b of the high-band noise reducing circuit 80. The low-band noise reducing circuit 10 further comprises a normal mode filter circuit 61 provided between the terminals 21a, 21b and the terminals 22a, 22b. The normal mode filter circuit 61 incorporates: a coil 63 having an end connected to the terminal 21a and the other end connected to the terminal 22a; and a capacitor 64 having an end connected to the terminal 22a and the other end connected to the terminal 22b.

Figure 21:
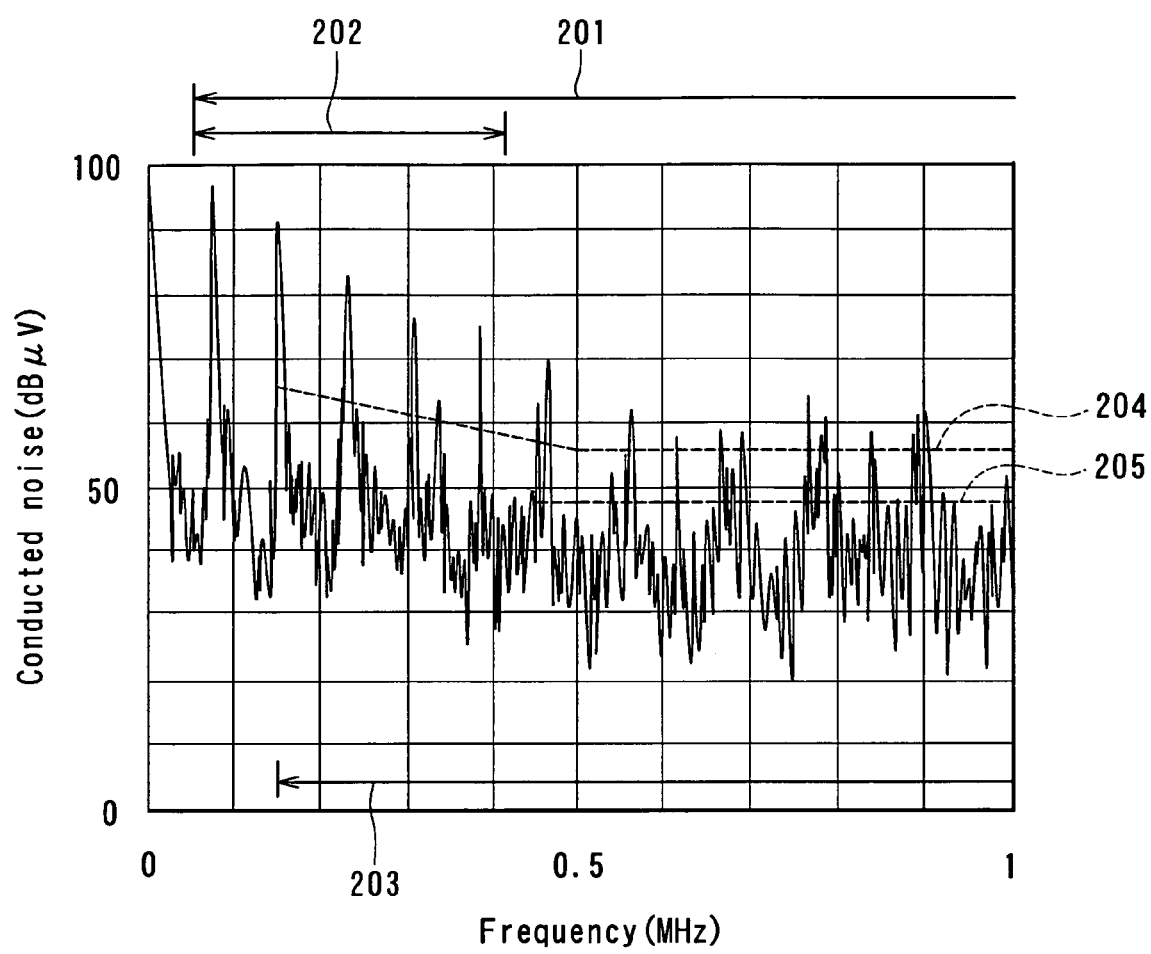
FIG. 21 is a plot showing an example of frequency characteristic of conducted noise of a switching power supply.

As shown in FIG. 21, normal mode noise is particularly problematic in a frequency range of 1 MHz and lower. Therefore, the low-band noise reducing circuit 10 of FIG. 5 comprises the normal mode noise filter circuit 61 so as to reduce normal mode noise in a frequency range of 1 MHz and lower. It is acceptable that the normal mode filter circuit 61 is disposed in series with respect to the high-band noise reducing circuit 80. Therefore, the location of the normal mode filter circuit 61 is not limited to a location between the electronic apparatus 2 and the high-band noise reducing circuit 80, but may be a location between the high-band noise reducing circuit 80 and the power line 4, or may be a location that is connected to the input or output of a rectifier circuit of the switching power supply.

As shown in FIG. 21, not only normal mode noise but also common mode noise could exist in a frequency range of 1 MHz and lower. Therefore, the low-band noise reducing circuit 10 shown in FIG. 6 is designed to reduce normal mode noise and common mode noise in a frequency range of 1 MHz and lower. The low-band noise reducing circuit 10 of FIG. 6 has such a configuration that a common mode filter circuit 62 is provided between the normal mode filter circuit 61 and the terminals 21a and 21b, in addition to the configuration of the low-band noise reducing circuit 10 of FIG. 5. The common mode filter circuit 62 incorporates a common mode choke coil 65. The common mode choke coil 65 has a single magnetic core 65a and two windings 65b and 65c wound around the core 65a. The winding 65b has an end connected to the terminal 21a and the other end connected to the coil 63 of the normal mode filter circuit 61. The winding 65c has an end connected to the terminal 21b and the other end connected to the terminal 22b.

To design the common mode choke coil 65 of the low-band noise reducing circuit 10 of FIG. 6, it is only the effect of reducing common mode noise in a low frequency range of 1 MHz and lower that is to be considered. Therefore, it is not necessary to employ a specific configuration for reducing an interwinding stray capacitance of the coil 65. As a result, the common mode filter circuit 62 that is inexpensive is achieved.

Figure 7:
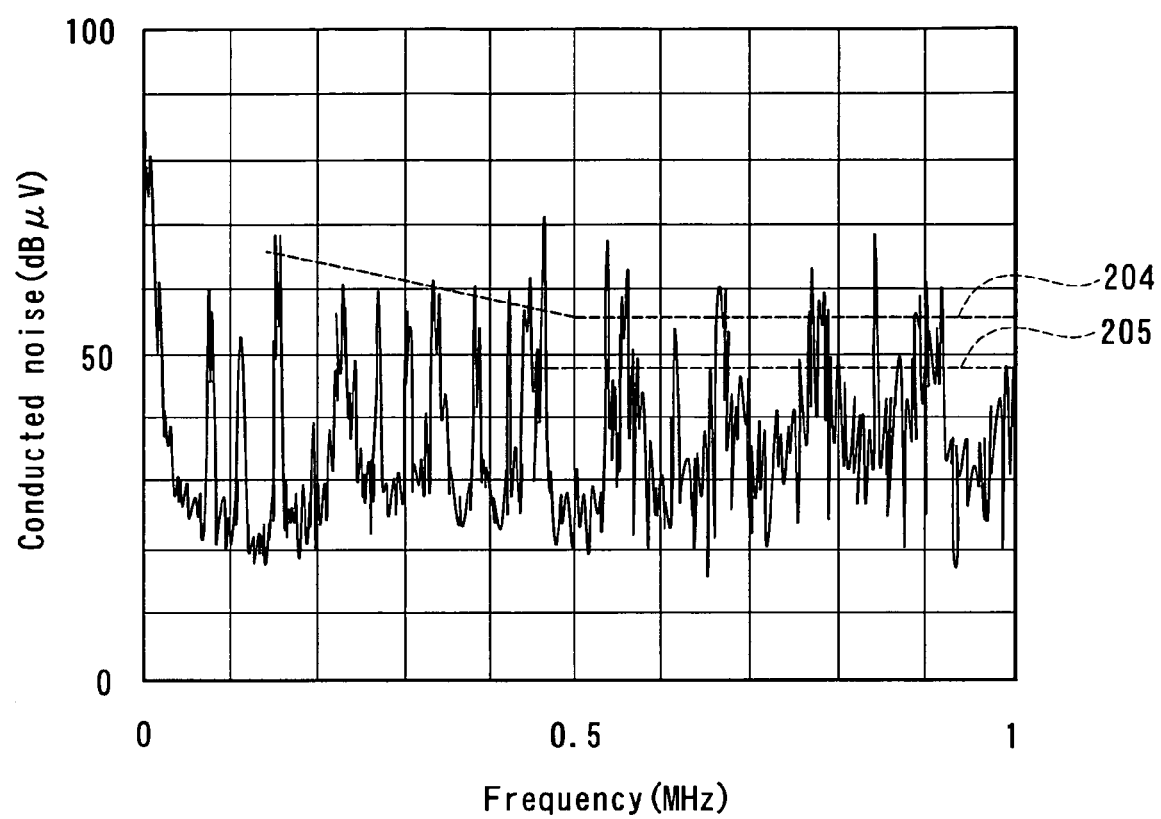
FIG. 7 is a plot showing an effect of the low-band noise reducing circuit of FIG. 5.
Figure 8:
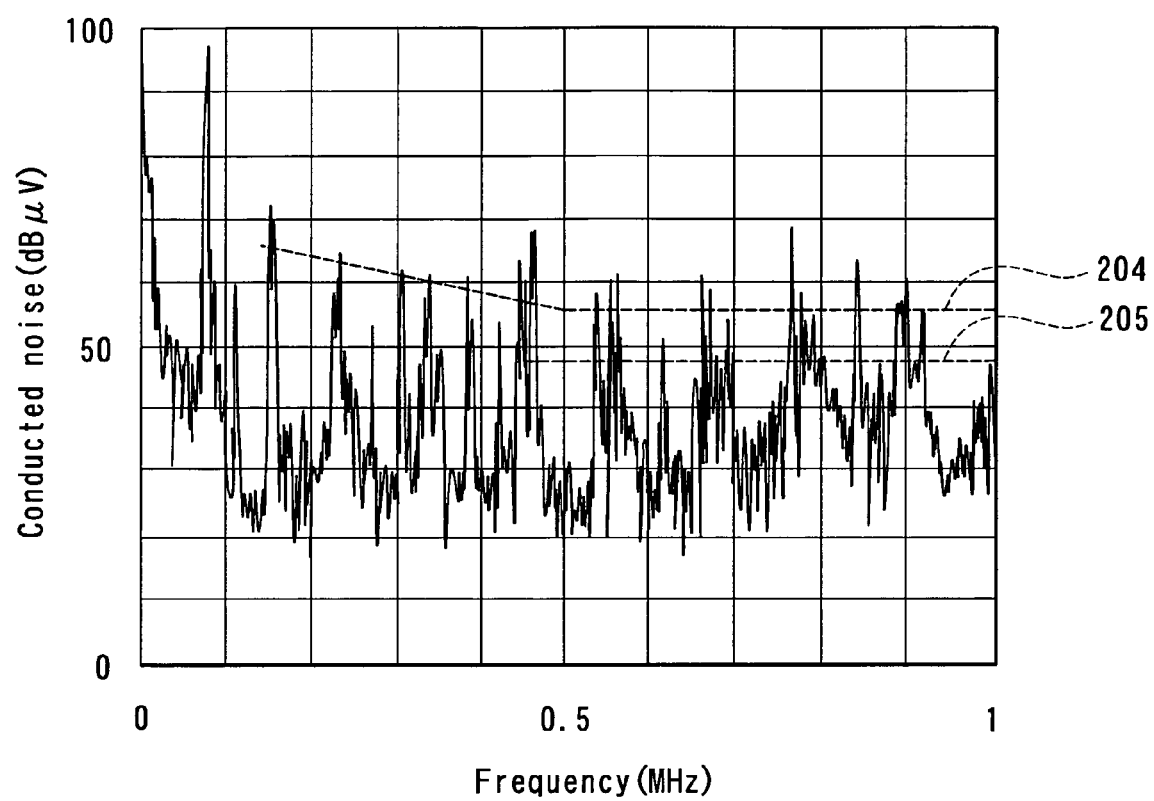
FIG. 8 is a plot showing the effect of the low-band noise reducing circuit of FIG. 5.
Figure 9:
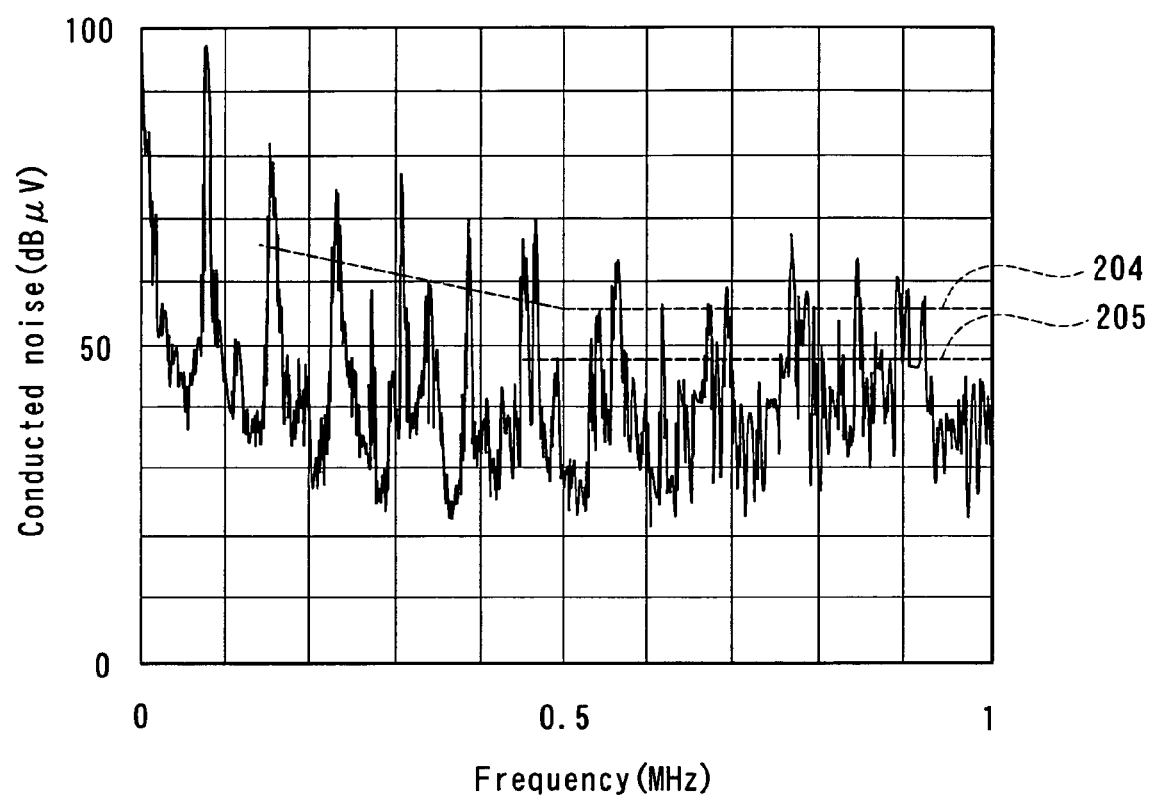
FIG. 9 is a plot showing the effect of the low-band noise reducing circuit of FIG. 5.
Figure 10:
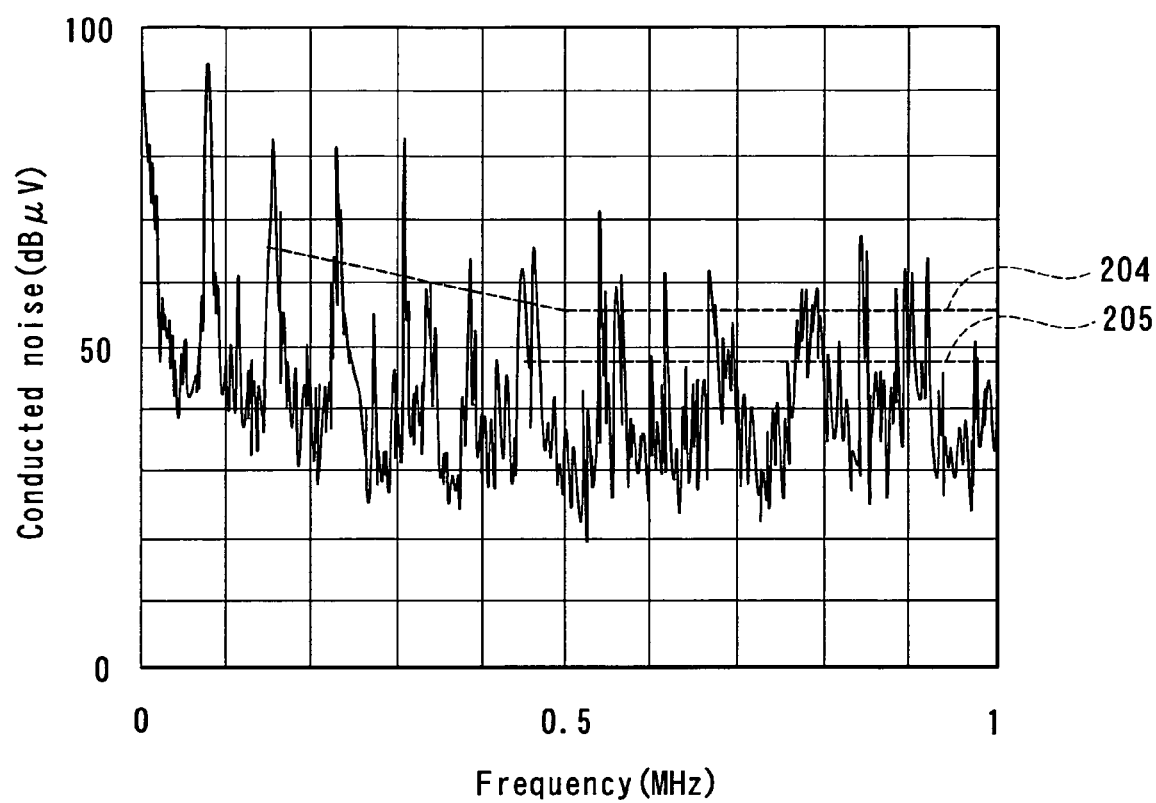
FIG. 10 is a plot showing the effect of the low-band noise reducing circuit of FIG. 5.

Reference is now made to FIG. 7 to FIG. 10 to describe the relationship between the characteristic of the low-band noise reducing circuit 10 of FIG. 5 and the inductance of the coil 63 and the capacitance of the capacitor 64 of the low-band noise reducing circuit 10. FIG. 7 to FIG. 10 each illustrate an example of frequency characteristic of conducted noise when the low-band noise reducing circuit 10 of FIG. 5 is connected to the switching power supply having the frequency characteristic of conducted noise shown in FIG. 21. In the example of FIG. 7 the coil 63 has an inductance of 380 µH, and the capacitor 64 is made up of four capacitors each having a capacitance of 0.47 µF and therefore has a capacitance of 0.47×4 µF. In the example of FIG. 8 the coil 63 has an inductance of 33 µH, and the capacitor 64 has a capacitance of 0.47 µF. In the example of FIG. 9 the coil 63 has an inductance of 33 µH, and capacitor 64 has a capacitance of 0.1 µF. In the example of FIG. 10 the coil 63 has an inductance of 33 µH, and capacitor 64 has a capacitance of 0.068 µF.

As shown in FIG. 7 to FIG. 10, the greater the inductance of the coil 63 and the capacitance of the capacitor 64, the greater is the effect of reducing noise in a frequency range of 1 MHz and lower. The examples of FIG. 7 to FIG. 10 show periodical peak values of conducted noise. According to the regulations relating to conducted noise, it is acceptable that periodical mean values of conducted noise are equal to or lower than the permissible level. In each of the examples of FIG. 7 to FIG. 10, the periodical mean value of the conducted noise is equal to or lower than the permissible level.

Consideration will now be given to preferred values of the inductance of the coil 63 and the capacitance of the capacitor 64 of the low-band noise reducing circuit 10 of FIG. 5. Here, the impedance of the coil 63 is $X_L$, the inductance of the coil 63 is L, the impedance of the capacitor 64 is $X_C$, and the capacitance of the capacitor 64 is C. With regard to the low-band noise reducing circuit 10 of FIG. 5, the voltage of normal mode noise between the terminals 21a and 21b is $V_{in}$, and the voltage of normal mode noise between the terminals 22a and 22b is $V_{out}$. The relationship between $V_{in}$ and $V_{out}$ is expressed by the equation below, where "ω" is the angular frequency of the noise, and "j" is $\sqrt{(-1)}$.

$$V_{out} = V_{in} \times \{X_C / (X_L + X_C)\}$$
$$= V_{in} \times [(-1/j\omega C)/\{j\omega L - (1/j\omega C)\}]$$
$$= V_{in} \times \{1/(\omega^2 \cdot L \cdot C + 1)\}$$
$$\approx V_{in} \times (1/\omega^2 \cdot L \cdot C)$$

As the above equation shows, it is noted that the greater the value of L×C, the greater is the effect of reducing noise. Here, L is equal to xµH, and C is equal to yµF. In the example of FIG. 7, xy is equal to 714.4. In the example of FIG. 8, xy is equal to 15.51. In the example of FIG. 9, xy is equal to 3.3. In the example of FIG. 10, xy is equal to 2.244. Therefore, xy≧2 is preferred for the conducted noise having the characteristic shown in FIG. 21. However, xy≧1, for example, is sufficient in some cases, depending on the noise level.

To obtain an enhanced effect of reducing noise in a low frequency range of 1 MHz and lower, it is effective to employ a parallel resonant circuit that resonates at a specific resonant frequency equal to or lower than 1 MHz, as will be described later.

Figure 11:
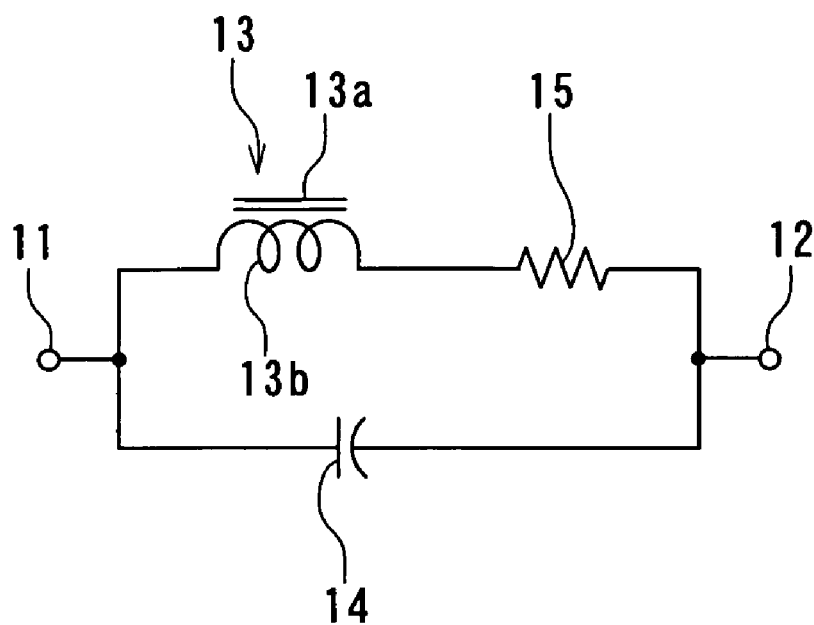
FIG. 11 is a schematic diagram of a parallel resonant circuit.
Figure 12:
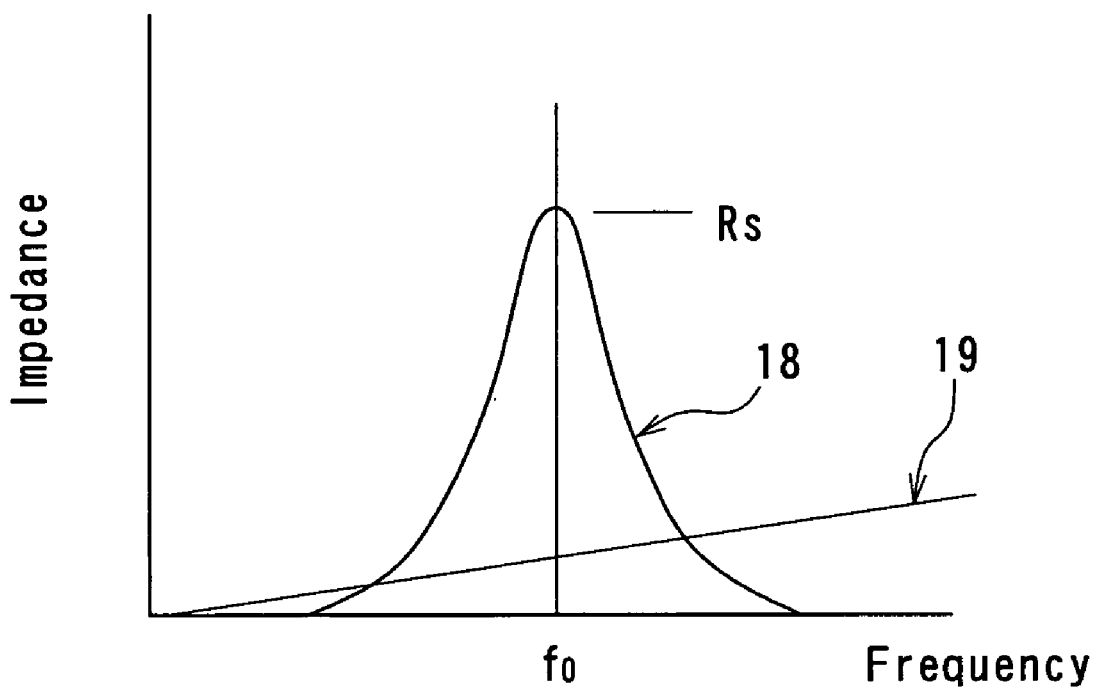
FIG. 12 schematically illustrates the frequency characteristic of the absolute value of impedance of the parallel resonant circuit of FIG. 11.

Reference is now made to FIG. 11 and FIG. 12 to describe the parallel resonant circuit. FIG. 11 is a schematic diagram of the parallel resonant circuit. The parallel resonant circuit comprises: two terminals 11 and 12; and a coil 13 and a capacitor 14 connected in parallel to each other between the terminals 11 and 12. The coil 13 has a magnetic core 13a and a winding 13b wound around the core 13a. In FIG. 11 numeral 15 indicates an imaginary resistor having a resistance equal to an internal resistance of the coil 13 resulting from factors such as magnetic loss in the core 13a. As shown in FIG. 11, it is assumed that the imaginary resistor 15 is connected to the coil 13 in series.

Here, the inductance of the coil 13 of FIG. 11 is L, the capacitance of the capacitor 14 is C, and the resistance of the resistor 15 is Rs. The resonant frequency $f_0$ of the parallel resonant circuit of FIG. 11 is expressed by the equation below.

$$f_0 = 1/\{2\pi\sqrt{(L \cdot C)}\}$$

FIG. 12 schematically illustrates a frequency characteristic of the absolute value of the impedance of each of the parallel resonant circuit and the coil 13 of FIG. 11. In FIG. 12 numeral 18 indicates the characteristic of the parallel resonant circuit, and numeral 19 indicates the characteristic of the coil 13 alone. As shown in FIG. 12, the absolute value of the impedance of the parallel resonant circuit has a peak value at the resonant frequency $f_0$. The peak value is equal to the resistance Rs. In contrast, the absolute value of the impedance of the coil 13 alone is expressed as $2\pi f L$ where the frequency is f. At the resonant frequency $f_0$, the absolute value of the impedance of the parallel resonant circuit is much greater than the absolute value of the impedance of the coil 13 alone. Therefore, it is noted that noise is effectively reduced if the parallel resonant circuit is inserted somewhere along the conductive line, and the resonant frequency $f_0$ of the parallel resonant circuit is defined to have a value close to the frequency of the noise to be reduced. In the parallel resonant circuit of FIG. 11, it is possible to change the resonant frequency $f_0$ by changing at least one of the inductance L of the coil 13 and the capacitance C of the capacitor 14. A simple and preferred method of changing the resonant frequency $f_0$ of the parallel resonant circuit is that the capacitor 14 of the parallel resonant circuit is made replaceable, and the capacitance C of the capacitor 14 is changed by replacing the capacitor 14.

Figure 13:
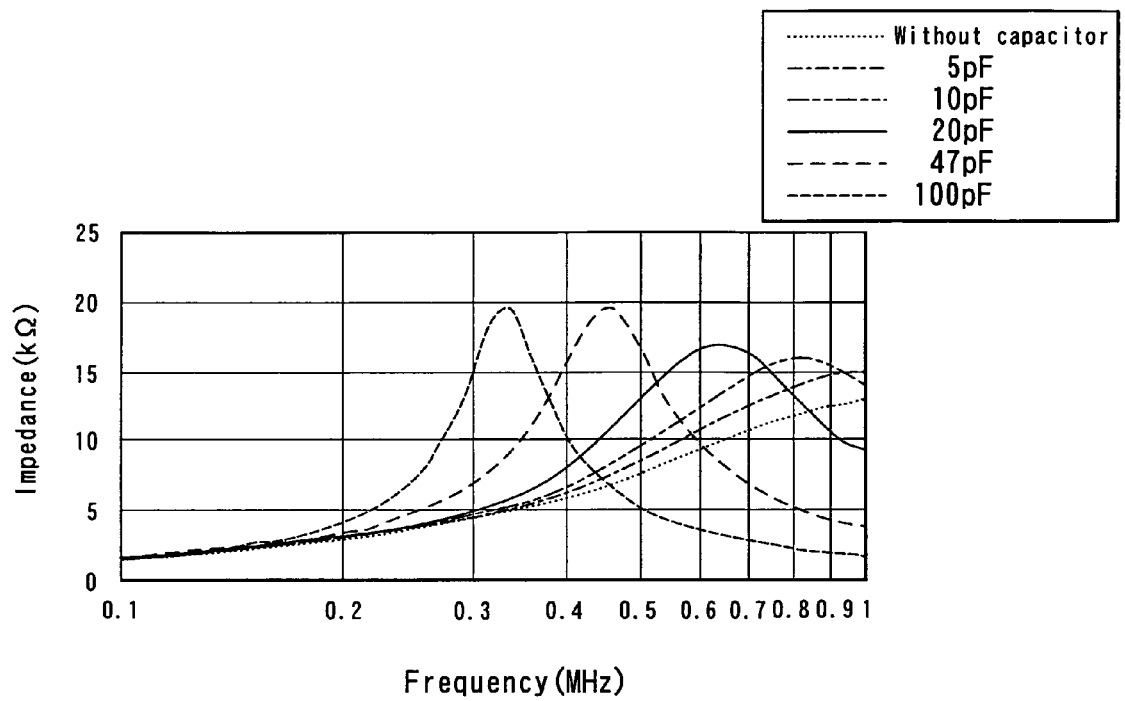
FIG. 13 is a plot showing variation in frequency characteristic of the absolute value of impedance of the parallel resonant circuit of FIG. 11 wherein the capacitance of the capacitor is changed.

Reference is now made to FIG. 13 to describe variation in frequency characteristic of the absolute value of the impedance when the capacitance of the capacitor 14 is changed in the parallel resonant circuit of FIG. 11. FIG. 13 shows the characteristics in a case in which the capacitor 14 is not provided, that is, the coil 13 is only provided, and in five cases in which the capacitor 14 has capacitances C of 5 pF, 10 pF, 20 pF, 47 pF and 100 pF, respectively. The inductance L is 2 mH, and the resistance Rs is 20 ohms.

As shown in FIG. 13, according to the parallel resonant circuit of FIG. 11, it is noted that the absolute value of the impedance is greater at the resonant frequency $f_0$, compared with the case in which the coil 13 alone is provided. For example, with regard to the parallel resonant circuit wherein the capacitor 14 has a capacitance C of 100 pF, the absolute value of the impedance is approximately four times the value obtained when the coil 13 alone is provided.

As shown in FIG. 13, according to the parallel resonant circuit of FIG. 11, it is noted that the resonant frequency $f_0$ is easily controlled by changing the capacitance C of the capacitor 14.

If the coil 13 alone is provided, it is required that the inductance L of the coil 13 is of a very great value such as 20 mH or greater, so as to obtain a sufficiently great absolute value of impedance at a frequency as low as some hundred kHz. According to the parallel resonant circuit of FIG. 11, in contrast, it is possible to obtain a sufficiently great absolute value of impedance at a low frequency of 1 MHz or lower while the inductance L of the coil 13 is reduced down to approximately 2 mH. It is thereby possible to reduce the coil 13 in size.

There exists an interwinding stray capacitance of the coil 13 of FIG. 11. Therefore, even when the coil 13 alone is provided, the coil 13 is made to have a parallel resonant characteristic by means of the inductance L of the coil 13 and the interwinding stray capacitance of the coil 13. In this case, however, the resonant frequency is high since the interwinding stray capacitance of the coil 13 is low. It is therefore difficult to obtain a great absolute value of impedance in a frequency range of 1 MHz and lower.

Reference is now made to FIG. 14 to FIG. 19 to describe six examples of circuit configuration of the low-band noise reducing circuit 10 including the parallel resonant circuit.

Figure 14:
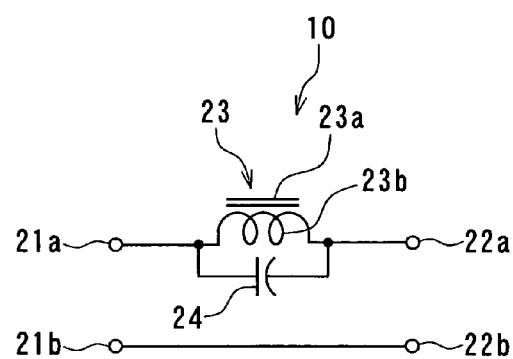
FIG. 14 is a schematic diagram illustrating a first example of configuration of the low-band noise reducing circuit including a parallel resonant circuit.

The low-band noise reducing circuit 10 of the first example shown in FIG. 14 comprises: the two terminals 21a and 21b connected to the electronic apparatus 2 through the conductive lines 3a and 3b; and the two terminals 22a and 22b connected to the two terminals 81a and 81b of the high-band noise reducing circuit 80. The terminals 21b and 22b are connected to each other through a conductive line. The low-band noise reducing circuit 10 further comprises a coil 23 and a capacitor 24 connected in parallel to each other between the terminals 21a and 22a. The coil 23 has a magnetic core 23a and a winding 23b wound around the core 23a. The coil 23 and the capacitor 24 make up the parallel resonant circuit. The low-band noise reducing circuit 10 of FIG. 14 reduces normal mode noise.

Figure 15:
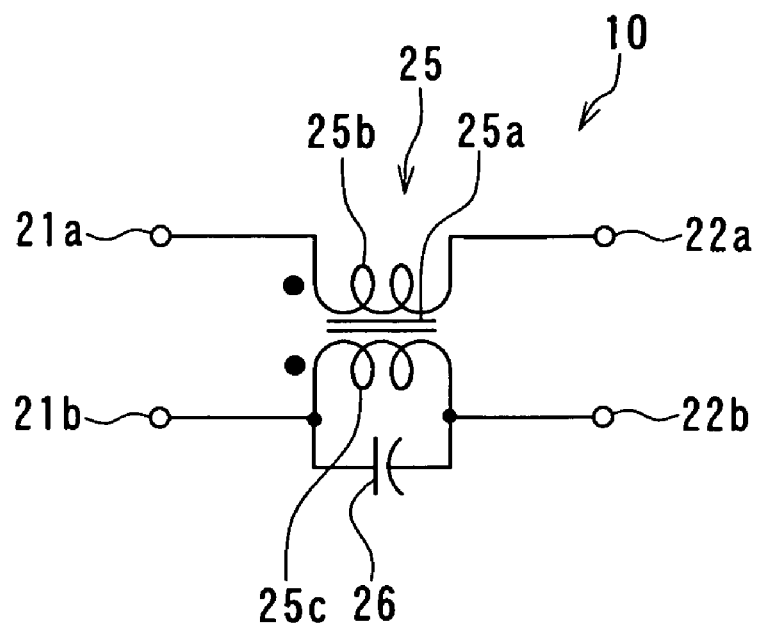
FIG. 15 is a schematic diagram-illustrating a second example of configuration of the low-band noise reducing circuit including the parallel resonant circuit.

The low-band noise reducing circuit 10 of the second example shown in FIG. 15 comprises the terminals 21a, 21b, 22a and 22b, as the circuit of FIG. 14. The low-band noise reducing circuit 10 of FIG. 15 further comprises a common mode choke coil 25 provided between the terminals 21a, 21b and the terminals 22a, 22b. The choke coil 25 has a single magnetic core 25a and two windings 25b and 25c wound around the core 25a. The winding 25b has an end connected to the terminal 21a and the other end connected to the terminal 22a. The winding 25c has an end connected to the terminal 21b and the other end connected to the terminal 22b. The windings 25b and 25c are wound around the core 25a in such directions that, when magnetic fluxes are induced in the core 25a by currents flowing through the windings 25b and 25c when a normal-mode current is fed to the windings 25b and 25c, these fluxes are cancelled out by each other. The low-band noise reducing circuit 10 further comprises a capacitor 26 connected in parallel to the winding 25c. The winding 25c and the capacitor 26 make up the parallel resonant circuit. The low-band noise reducing circuit 10 of FIG. 15 reduces common mode noise. Alternatively, the capacitor 26 may be connected in parallel to the winding 25b, instead of being connected in parallel to the winding 25c.

Figure 16:
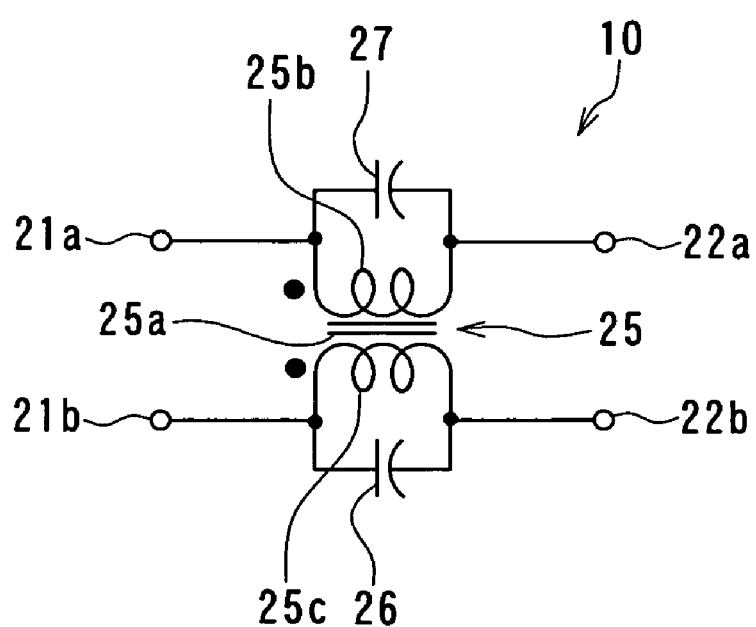
FIG. 16 is a schematic diagram illustrating a third example of configuration of the low-band noise reducing circuit including the parallel resonant circuit.

The low-band noise reducing circuit 10 of the third example shown in FIG. 16 is made up of the circuit of FIG. 15 to which a capacitor 27 connected in parallel to the winding 25b is added. The capacitors 26 and 27 have equal capacitances. In the low-band noise reducing circuit 10 of FIG. 16, the parallel resonant circuit is made up of the common mode choke coil 25 and the capacitors 26 and 27. The low-band noise reducing circuit 10 reduces common mode noise.

Figure 17:
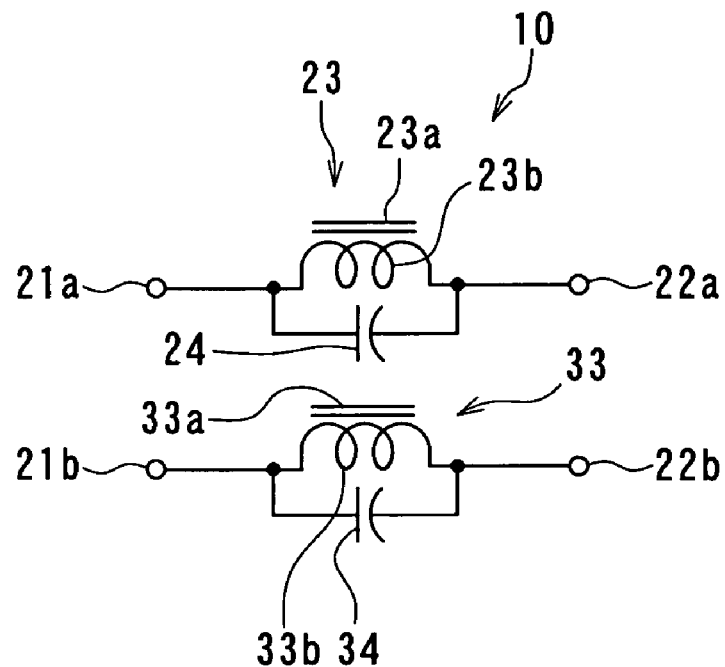
FIG. 17 is a schematic diagram illustrating a fourth example of configuration of the low-band noise reducing circuit including the parallel resonant circuit.

The low-band noise reducing circuit 10 of the fourth example shown in FIG. 17 is made up of the circuit of FIG. 14 to which a coil 33 and a capacitor 34 are added, the coil 33 and the capacitor 34 being connected in parallel to each other between the terminals 21b and 22b. The coil 33 has a magnetic core 33a and a winding 33b wound around the core 33a. In the low-band noise reducing circuit 10 of FIG. 17, the coil 23 and the capacitor 24 make up a first parallel resonant circuit, and the coil 33 and the capacitor 34 make up a second parallel resonant circuit. The low-band noise reducing circuit 10 of FIG. 17 reduces normal mode noise and common mode noise.

Figure 18:
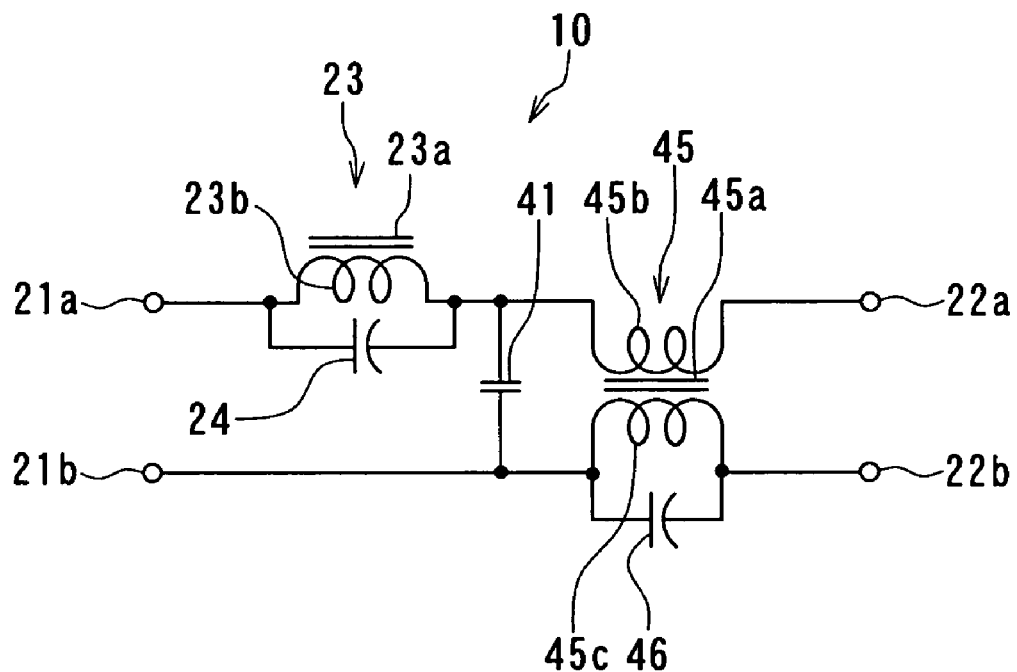
FIG. 18 is a schematic diagram illustrating a fifth example of configuration of the low-band noise reducing circuit including the parallel resonant circuit.

The low-band noise reducing circuit 10 of the fifth example shown in FIG. 18 is made up of the circuit of FIG. 14 to which a capacitor 41, a common mode choke coil 45 and a capacitor 46 are added. The capacitor 41 has an end connected to the node between the coil 23 and the capacitor 24, the node being located opposite to the terminal 21a. The capacitor 41 has the other end connected to the terminal 21b. The choke coil 45 has a single magnetic core 45a and two windings 45b and 45c wound around the core 45a. The winding 45b has an end connected to the one of the ends of the capacitor 41, and the other end connected to the terminal 22a. The winding 45c has an end connected to the other of the ends of the capacitor 41, and the other end connected to the terminal 22b. The windings 45b and 45c are wound around the core 45a in such directions that, when magnetic fluxes are induced in the core 45a by currents flowing through the windings 45b and 45c when a normal-mode current is fed to the windings 45b and 45c, these fluxes are cancelled out by each other. The capacitor 46 is connected in parallel to the winding 45c. Alternatively, the capacitor 46 may be connected in parallel to the winding 45b, instead of being connected in parallel to the winding 45c. Another alternative is that another capacitor may be connected in parallel to the winding 45b in addition to the capacitor 46 connected in parallel to the winding 45c.

In the low-band noise reducing circuit 10 of FIG. 18, the coil 23 and the capacitor 24 make up the first parallel resonant circuit, and the winding 45c and the capacitor 46 make up the second parallel resonant circuit. In the low-band noise reducing circuit 10, normal mode noise is reduced by the parallel resonant circuit made up of the coil 23 and the capacitor 24. Common mode noise is reduced by the common mode choke coil 45 and the capacitor 46.

Figure 19:
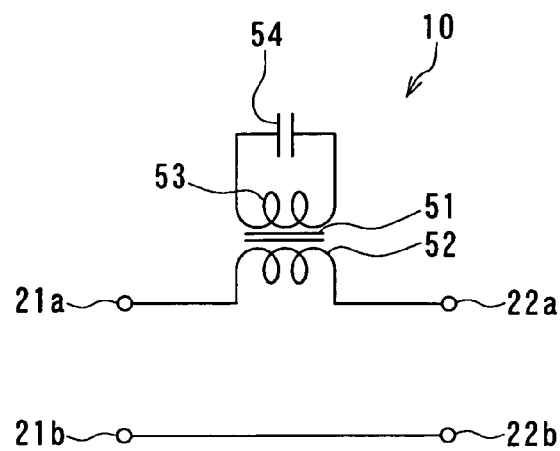
FIG. 19 is a schematic diagram illustrating a sixth example of configuration of the low-band noise reducing circuit including the parallel resonant circuit.

The low-band noise reducing circuit 10 of the sixth example shown in FIG. 19 comprises the terminals 21a, 21b, 22a and 22b, as the circuit of FIG. 14. The low-band noise reducing circuit 10 of FIG. 19 further comprises: a single magnetic core 51; a first winding 52 and a second winding 53 that are wound around the core 51; and a capacitor 54 provided across the second winding 53. The first winding 52 has an end connected to the terminal 21a and the other end connected to the terminal 22a. The second winding 53 and the capacitor 54 make up the parallel resonant circuit. Since the first winding 52 is magnetically coupled to the second winding 53 through the core 51, the first winding 52 has a parallel resonant characteristic the same as that of the above-mentioned parallel resonant circuit. That is, the absolute value of impedance of the first winding 52 has a peak value at the resonant frequency of the above-mentioned parallel resonant circuit. The low-band noise reducing circuit 10 of FIG. 19 reduces normal mode noise.

In the low-band noise reducing circuit 10 of FIG. 19, a current used for transferring power is fed through the first winding 52. Therefore, it is impossible that the number of turns of the winding 52 is made too large and that the winding 52 is made too thin. In contrast, since a current used for transferring power is not fed through the second winding 53, it is possible to increase the number of turns of the winding 53 and to reduce the thickness of the winding 53. As a result, the low-band noise reducing circuit 10 of FIG. 19 provides a wide range of values selectable as the inductance of the winding 53, and a wide range of selectable resonant frequencies, too.

Taking advantage of the above-mentioned feature of the winding 53, it is possible to make the winding 53 have a large number of turns such as 100 turns and to thereby increase the interwinding stray capacitance of the winding 53 so as to omit the capacitor 54. In this case, it is possible to make up a parallel resonant circuit that resonates at a resonant frequency determined by the inductance of the winding 53 and the interwinding stray capacitance of the winding 53.

Each of the low-band noise reducing circuits 10 of FIG. 14 to FIG. 19 reduces noise in a frequency range including the resonant frequency of the parallel resonant circuit. A frequency equal to or lower than 1 MHz, for example, is chosen as the resonant frequency. The frequency range in which the low-band noise reducing circuit 10 reduces noise is determined such that the range includes the frequency at which the magnitude of noise emerging from the electronic apparatus 2 has a peak value.

Figure 20:
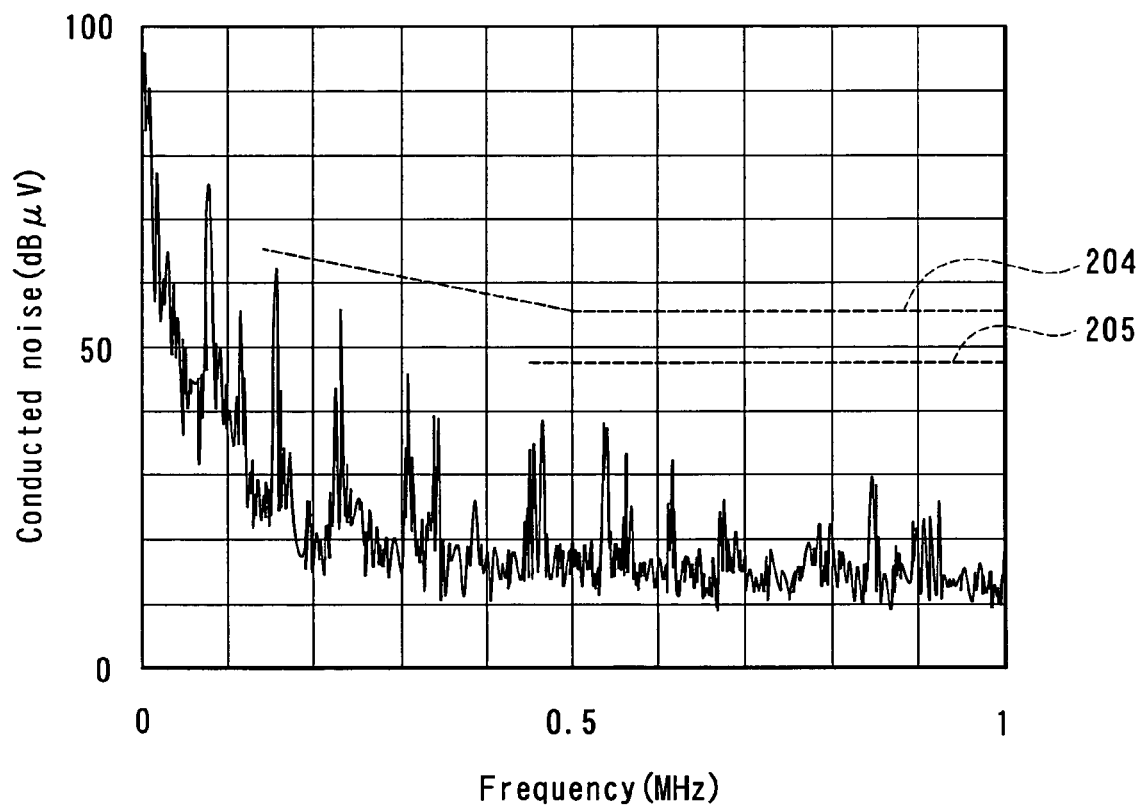
FIG. 20 is a plot showing an effect of the low-band noise reducing circuit of FIG. 14.

FIG. 20 illustrates an example of frequency characteristic of conducted noise when the low-band noise reducing circuit 10 of FIG. 14 is connected to the switching power supply having the frequency characteristic of conducted noise shown in FIG. 21. In this example the resonant frequency of the low-band noise reducing circuit 10 is chosen to be 200 kHz. If comparison is made between FIG. 20 and FIG. 21, it is noted that the low-band noise reducing circuit 10 of FIG. 14 is capable of reducing noise in a frequency range of 1 MHz and lower.

As thus described, the noise suppressing circuit 1 of the embodiment reduces noise in a high frequency band through the use of the high-band noise reducing circuit 80, and reduces noise in a low frequency band through the use of the low-band noise reducing circuit 10. As a result, the noise suppressing circuit 1 is capable of suppressing noise in a wide range of frequencies.

According to the noise suppressing circuit 1 of the embodiment, if the low-band noise reducing circuit 10 includes the parallel resonant circuit, the resonant frequency is easily changed by changing at least one of the inductance of the coil and the capacitance of the capacitor of the parallel resonant circuit. As a result, the frequency range in which the low-band noise reducing circuit 10 reduces noise is easily chosen to be a desired frequency range.

According to the embodiment, the low-band noise reducing circuit 10 and the high-band noise reducing circuit 80 may be encased in the enclosure 5 that functions as the ground of the high-band noise reducing circuit 80, and the high-band noise reducing circuit 80 may be located closer to the enclosure 5 than the low-band noise reducing circuit 10. In this case, it is possible that the portion of the high-band noise reducing circuit 80 connected to the ground is connected to the enclosure 5 as the ground through a short length of line. It is thereby possible to reduce the impedance of the high-band noise reducing circuit 80 to the ground.

The present invention is not limited to the foregoing embodiment but may be practiced in still other ways. For example, the configuration of the high-band noise reducing circuit 80 of the invention is not limited to the one shown in FIG. 2. For example, two paths each made up of the phase-inverted signal generating circuit 85 and the impedance element 88 may be provided, and the capacitors 84a and 86a may be connected to one of the paths and the capacitors 84b and 86b may be connected to the other one. The high-band noise reducing circuit 80 having such a configuration is capable of reducing normal mode noise and common mode noise.

According to the noise suppressing circuit of the invention thus described, noise in the first frequency range is reduced by the first noise reducing circuit, and noise in the second frequency range is reduced by the second noise reducing circuit, the second frequency range including frequencies lower than the frequencies in the first frequency range. As a result, according to the invention, it is possible to reduce noise in a wide range of frequencies.

In the noise suppressing circuit of the invention, the second noise reducing circuit may include the parallel resonant circuit that resonates at a specific resonant frequency, and may reduce noise in a frequency range including the resonant frequency. In this case, the frequency range in which the second noise reducing circuit reduces noise is easily chosen to be a desired frequency range.

Obviously many modifications and variations of the present invention are possible in the light of the above teachings. It is therefore to be understood that within the scope of the appended claims the invention may be practiced otherwise than as specifically described.

What is claimed is:

1. A noise suppressing circuit that is inserted somewhere along two conductive lines connected to a noise source and that suppresses noise emerging from the noise source and propagating through the conductive lines, the noise suppressing circuit comprising:
a first noise reducing circuit for reducing noise mainly in a first frequency range; and
a second noise reducing circuit for reducing noise mainly in a second frequency range including frequencies lower than frequencies in the first frequency range, wherein
the first noise reducing circuit incorporates: a detection means disposed in a specific location along the conductive lines and detecting noise propagating through the conductive lines; a phase-inverted signal generating means for generating a phase-inverted signal that has a phase opposite to a phase of the noise detected by the detection means; and a noise canceling means disposed in a location different from the location of the detection means along the conductive lines and injecting the phase-inverted signal generated by the phase-inverted signal generating means into the conductive lines to cancel out the noise on the conductive lines.

2. The noise suppressing circuit according to claim 1, wherein the first noise reducing circuit reduces common mode noise.

3. The noise suppressing circuit according to claim 1, wherein the second noise reducing circuit reduces normal mode noise.

4. The noise suppressing circuit according to claim 1, wherein the second noise reducing circuit includes a parallel resonant circuit that resonates at a specific resonant frequency, and reduces noise in a frequency range including the resonant frequency.

5. The noise suppressing circuit according to claim 4, wherein the frequency range in which the second noise reducing circuit reduces the noise is chosen to include a frequency at which a magnitude of noise emerging from the noise source has a peak value.

6. The noise suppressing circuit according to claim 4, wherein the second noise reducing circuit incorporates a coil inserted somewhere along one of the conductive lines and a capacitor connected in parallel to the coil, and the coil and the capacitor make up the parallel resonant circuit.

7. The noise suppressing circuit according to claim 4, wherein the second noise reducing circuit incorporates a single magnetic core, two windings wound around the core, and a capacitor connected in parallel to one of the windings, wherein the one of the windings is inserted somewhere along one of the conductive lines, the other of the windings is inserted somewhere along the other of the conductive lines, and the one of the windings and the capacitor make up the parallel resonant circuit.

8. The noise suppressing circuit according to claim 4, wherein the second noise reducing circuit incorporates a first coil inserted somewhere along one of the conductive lines, a first capacitor connected in parallel to the first coil, a second coil inserted somewhere along the other of the conductive lines, and a second capacitor connected in parallel to the second coil, wherein the first coil and the first capacitor make up a first parallel resonant circuit, and the second coil and the second capacitor make up a second parallel resonant circuit.

9. The noise suppressing circuit according to claim 4, wherein the second noise reducing circuit incorporates a coil inserted somewhere along one of the conductive lines, a first capacitor connected in parallel to the coil, a single magnetic core, two windings wound around the core, and a second capacitor connected in parallel to one of the windings, wherein the one of the windings is inserted somewhere along one of the conductive lines, the other of the windings is inserted somewhere along the other of the conductive lines, the coil and the first capacitor make up a first parallel resonant circuit, and the one of the windings and the second capacitor make up a second parallel resonant circuit.

10. The noise suppressing circuit according to claim 4, wherein the second noise reducing circuit incorporates a single magnetic core, a first winding and a second winding that are wound around the core, and a capacitor provided across the second winding, wherein the first winding is inserted somewhere along one of the conductive lines, and the second winding and the capacitor make up the parallel resonant circuit.

11. The noise suppressing circuit according to claim 4, wherein the second noise reducing circuit incorporates a single magnetic core, and a first winding and a second winding that are wound around the core, wherein the first winding is inserted somewhere along one of the conductive lines, and the second winding makes up the parallel resonant circuit that resonates at a resonant frequency determined by an inductance of the second winding and an interwinding stray capacitance of the second winding.

12. The noise suppressing circuit according to claim 4, wherein the resonant frequency is 1 MHz or lower.

* * * * *